(12) United States Patent
Lee et al.

(10) Patent No.: US 7,827,348 B2
(45) Date of Patent: Nov. 2, 2010

(54) HIGH PERFORMANCE FLASH MEMORY DEVICES (FMD)

(75) Inventors: Charles C. Lee, Cupertino, CA (US); I-Kang Yu, Palo Alto, CA (US); David Q. Chow, San Jose, CA (US); Abraham Chih-Kang Ma, Fremont, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 501 days.

(21) Appl. No.: 12/017,249

(22) Filed: Jan. 21, 2008

(65) Prior Publication Data

US 2008/0147968 A1    Jun. 19, 2008

Related U.S. Application Data

(63) Continuation-in-part of application No. 11/748,595, filed on May 15, 2007, now Pat. No. 7,471,556, which is a continuation-in-part of application No. 10/818,653, filed on Apr. 5, 2004, now Pat. No. 7,243,185.

(51) Int. Cl.
*G06F 12/00* (2006.01)
(52) U.S. Cl. .................. 711/103; 711/157; 711/165; 711/E12.008
(58) Field of Classification Search ............... None
See application file for complete search history.

(56) References Cited

U.S. PATENT DOCUMENTS

| | | | |
|---|---|---|---|
| 7,366,028 B2 | 4/2008 | Kagan et al. | |
| 7,376,011 B2 | 5/2008 | Conley et al. | |
| 7,386,655 B2 | 6/2008 | Gorobets et al. | |
| 7,389,397 B2 | 6/2008 | Paley et al. | |
| 7,395,384 B2 | 7/2008 | Sinclair et al. | |
| 7,716,312 B2 * | 5/2010 | Gamble | 709/223 |
| 2008/0049520 A1 * | 2/2008 | Kang et al. | 365/185.33 |
| 2008/0086590 A1 * | 4/2008 | Urabe | 711/103 |
| 2009/0083476 A1 * | 3/2009 | Pua et al. | 711/103 |

* cited by examiner

*Primary Examiner*—Reginald G Bragdon
*Assistant Examiner*—Aracelis Ruiz
(74) *Attorney, Agent, or Firm*—Roger H. Chu

(57) ABSTRACT

High performance flash memory devices (FMD) are described. According to one exemplary embodiment of the invention, a high performance FMD includes an I/O interface, a FMD controller, and at least one non-volatile memory module along with corresponding at least one channel controller. The I/O interface is configured to connect the high performance FMD to a host computing device The FMD contoller is configured to control data transfer (e.g., data reading, data writing/programming, and data erasing) operations between the host computing device and the non-volatile memory module. The at least one non-volatile memory module, comprising one or more non-volatile memory chips, is configured as a secondary storage for the host computing device. The at least one channel controller is configured to ensure proper and efficient data transfer between a set of data buffers located in the FMD controller and the at least one non-volatile memory module.

27 Claims, 29 Drawing Sheets

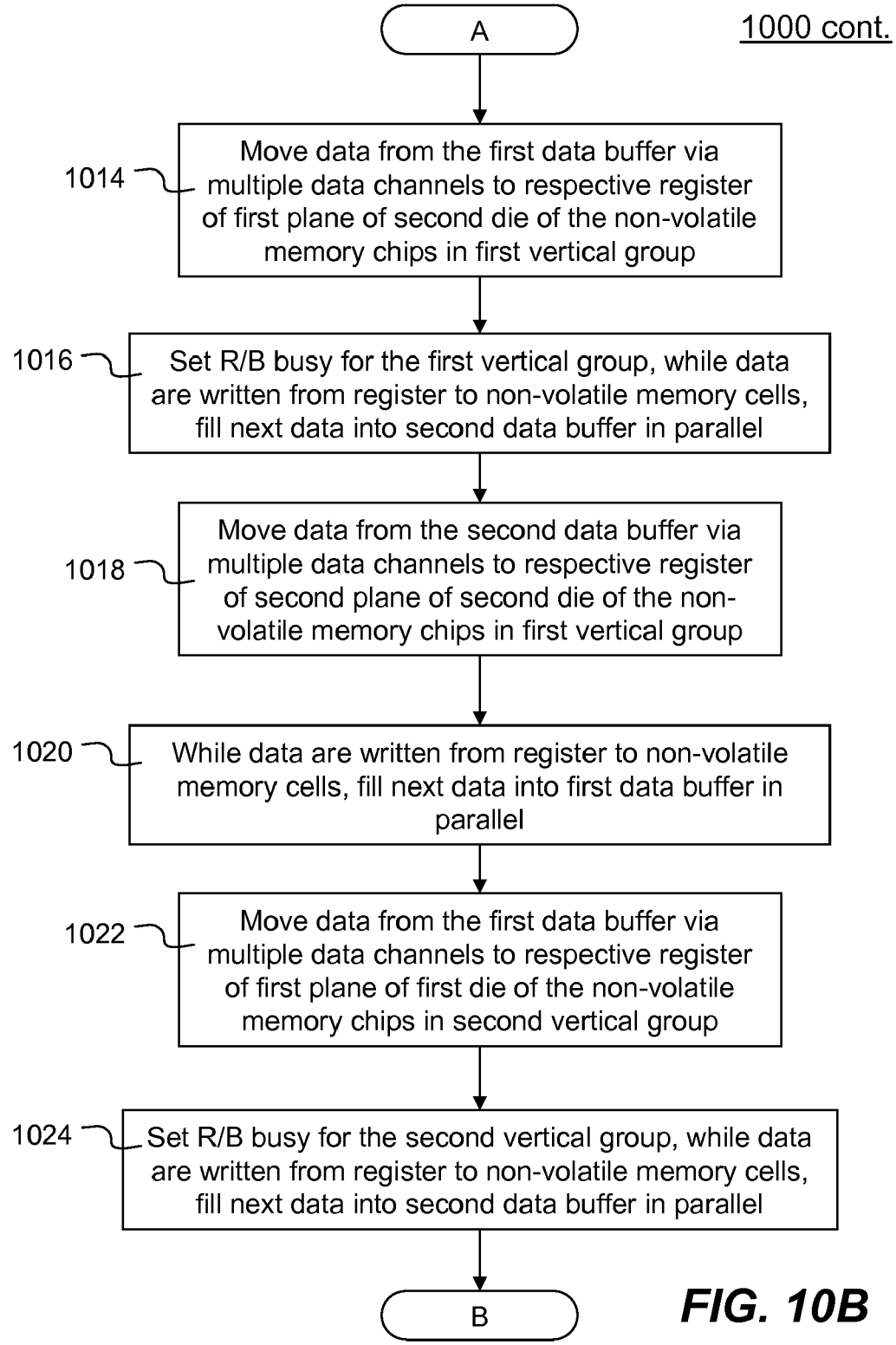

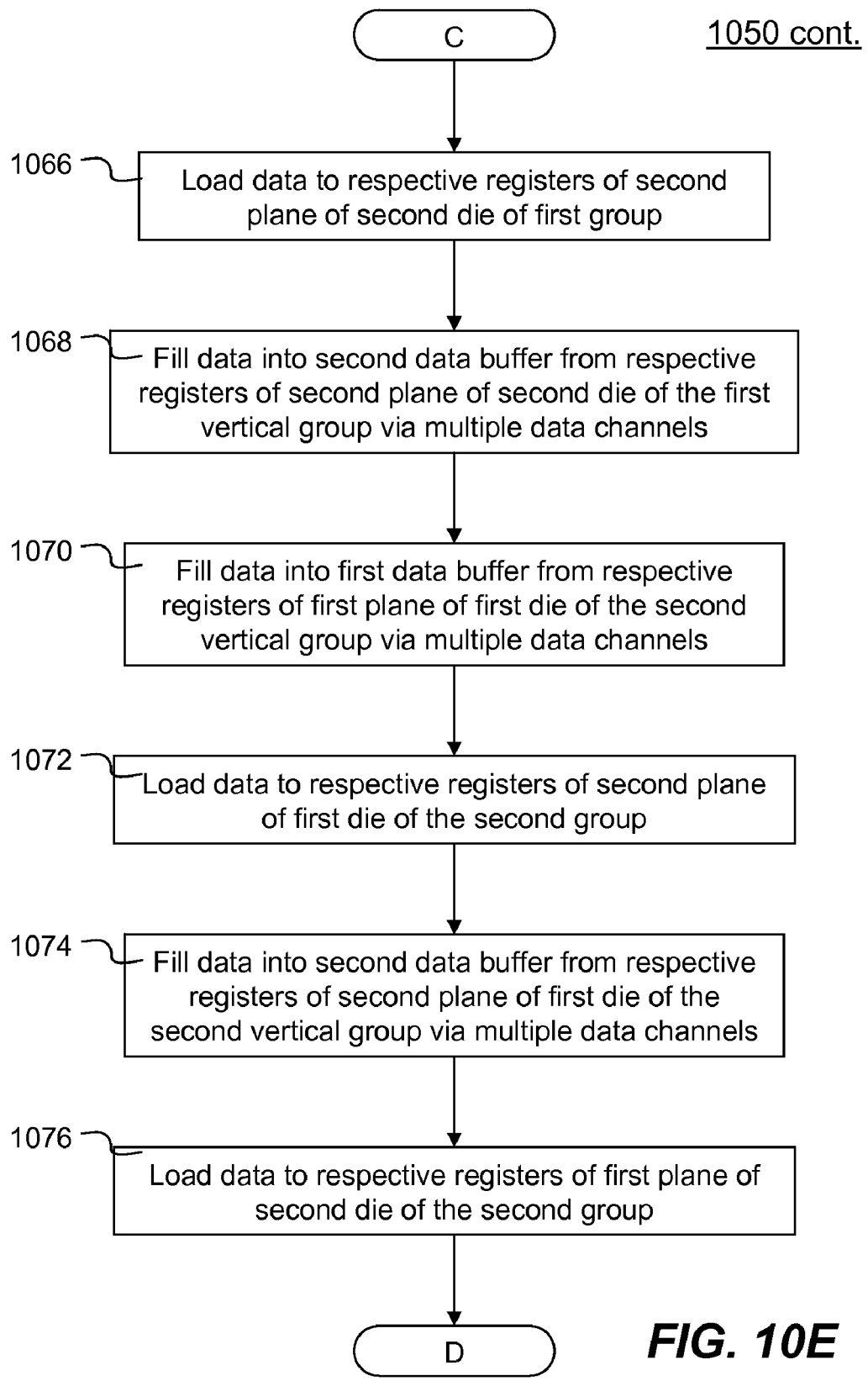

HIGH PERFORMANCE FLASH MEMORY DEVICES (FMD)

CROSS-REFERENCE TO RELATED APPLICATIONS

This application is a continuation-in-part (CIP) of U.S. patent application for "Local Bank Write Buffers for Acceleration a Phase Change Memory", U.S. application Ser. No. 11/748,595, filed May 15, 2007, now U.S. Pat. No. 7,471,556, which is CIP of "Flash Memory System with a High Speed Flash Controller", application Ser. No. 10/818,653, filed Apr. 5, 2004, now U.S. Pat. No. 7,243,185, content of which is incorporated herein as though set forth in full.

FIELD OF THE INVENTION

The present invention relates to flash memory devices used in computer systems, and more particularly to methods and systems for providing high performance flash memory device (FMD) in computer systems.

BACKGROUND OF THE INVENTION

Personal computers have become mainstream computing devices for the past two decades. One of the core components of a personal computer whether desktop or laptop is a mother board, which is the central or primary circuit board providing attachment points for one or more of the following: processor (CPU), graphics card, sound card, hard disk drive controller, memory (Random Access Memory (RAM)), and other external devices. All of the basic circuitry and components required for a personal computer to function are onboard the motherboard or are connected with a cable. The most important component on a motherboard is the chipset known as memory control hub (MCH) and input/output (I/O) control hub (ICH). MCH typically handles communications between CPU, RAM, Accelerated Graphics Port (AGP) or Peripheral Component Interconnect Express (PCI-E), and ICH. ICH controls real time clock, Universal-Serial-Bus (USB), Advance Power Management (APM) and other secondary storage devices such as hard disk drives.

Traditionally, hard disk drives have been used as a secondary storage in a computing device. With advance of non-volatile memory (e.g., flash memory), some attempts have been made to use non-volatile memory as the secondary storage. However, the non-volatile memory based secondary storage has not been able to achieve high performance, such as the level of the performance defined in Ultra Direct Memory Access (UDMA). DMA is referred to as transferring data from one storage device to memory to another device without using a central processing unit. UDMA is newer version of DMA with much higher speed or performance in its standards.

Therefore it would be desirable to provide a high performance flash memory device (FMD) in a computer system to achieve or exceed the performance defined in UDMA.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

High performance flash memory devices (FMD) are disclosed. According to one aspect of the present invention, a high performance FMD includes an input/output (I/O) interface, a FMD controller, and at least one non-volatile memory (e.g., flash memory) module along with corresponding at lest one channel controller. The I/O interface is configured to connect the high performance FMD to a host computing device (e.g., a computer, a consumer electronic device, a personal multimedia player, etc.). The FMD controller is configured to control data transfer (e.g., data reading, data writing/programming, and data erasing) operations between the host computing device and the non-volatile memory module. The at least one non-volatile memory module, comprising one or more non-volatile memory chips, is configured as a secondary storage for the host computing device. The at least one channel controller is configured to ensure proper and efficient data transfer between a set of data buffers located in the FMD controller and the at least one non-volatile memory module.

According to another aspect of the present invention, a plurality of independent data channels is configured to transfer data between the set of parallel data buffers and the at least one non-volatile memory module. Each of the set of parallel data buffer is divided into several sub-buffers (i.e., corresponding to number of the data channels) with each sub-buffer connecting to one of the data channels. Parallel data transmission is conducted through the data channels.

According to yet another aspect of the present invention, various data interleaving schemes are employed for data transmission to avoid any possible memory or hardware contention. In other words, data structure of each of the sub-buffers in the data buffers may be different in different applications (e.g., different data cluster size used in the host computing device).

According to yet another aspect, each of the at least one non-volatile memory chips comprises at least two dies with each die having at least two planes; each plane includes an independent data register to allow parallel data transfer. For example, one plane for data reading, the other for writing. The one or more the non-volatile memory chips in the at least one non-volatile memory module are arranged and wired in a two-dimensional scheme (horizontal and vertical). In the horizontal dimension, the chips are divided into several rows (e.g. four rows); while in the vertical dimension, the chips are partitioned into a number of groups across the rows. Each of the dies of a non-volatile memory chip is configured to be separately selectable by the at least one channel controllers.

According to yet another aspect, data transfers between the set of data buffers and the at least one non-volatile memory chips are conducted through all of the data channels in parallel, thereby achieving high performance. To further increase efficiency and performance, data transfer to and from each of the vertical groups may also be conducted in parallel.

According to yet another aspect, a task file register may be run at an internal clock speed faster than system clock speed to meet the high performance data transfer.

According to yet another embodiment, the non-volatile memory module may comprise single-level-cell (SLC), multi-bit-cell (MBC), or multi-level-cell (MLC) flash memory chips. SLC flash memory chip contains 2-bit of data per cell, while MBC or MLC contains more than 2-bit (e.g., 4, 8 or higher power of two).

According to an exemplary embodiment of the present invention, a high performance flash memory device (FMD) includes at least the following: a FMD interface configured to provide data input and output to a host computer system; at least one non-volatile memory module having one or more non-volatile memory chips that are arranged in a plurality of vertical groups and in a plurality of horizontal rows such that each of the vertical groups and each of the horizontal rows having one of said one or more non-volatile memory chips overlapped, wherein number of the non-volatile memory chips in said each of the vertical groups is equal to number of the plurality of horizontal rows; and a FMD controller configured to control data transmission between said at least one non-volatile memory module and the host computer system via said FMD interface, said FMD controller comprises a plurality of command registers, a control register, a data register, a high-low byte filer, a data multiplexer, a command decoder, a microcontroller, a data dispatching unit, an error correction code generator, a plurality of task file registers, a plurality of parallel data buffers and a plurality of independent data channels, each of the parallel data buffers is divided into a plurality of sub-buffers, each of the sub-buffers is connected to corresponding one of the parallel data channels, wherein each of the data channels connects to respective one of the horizontal rows and wherein said data transmission is conducted in parallel via the independent data channels in one of at least one data interleaving scheme.

The high performance FMD further includes at least one channel controller configured to control data transfer between the plurality of the parallel data buffers and said at least one non-volatile memory module.

According to another embodiment of the present invention, a method of data reading operations in high performance flash memory device (FMD) comprises at least the following steps: (a1) receiving a data read request; (a2) loading a first chunk of data to respective register of a first plane of a first die of the first group of non-volatile memory chips, and loading a fifth chunk of data to respective register of a first plane of a first die of the second group; (a3) filling the first chunk of data from the respective register of the first plane of the first die of the first group into a first data buffer; (a4) while the first chunk of data in the first data buffer is transferred to a host according to a predefined data interleaving scheme, loading a second chunk of data to respective register of a second plane of the first die of the first group, and then filling the second chunk of data from the respective register of the second plane of the first die of the first group into a second data buffer; (a5) while the second chunk of data in the second data buffer is transferred to the host according to the predefined data interleaving scheme, loading a third chunk of data to respective register of a first plane of a second die of the first group, and then filling the third chunk of data from the respective register of the first plane of the second die of the first group into the first data buffer; (a6) while the third chunk of data in the first data buffer is transferred to the host according to the predefined data interleaving scheme, loading a fourth chunk of data to respective register of a second plane of the second die of the first group, and then filling the fourth chunk of data from the respective register of the second plane of the second die of the first group into the second data buffer; (a7) while the fourth chunk of data in the second data buffer is transferred to the host according to the predefined data interleaving scheme, loading a new first chunk of data to respective register of the first plane of the first die of the first group, and filling the fifth chunk of data from the respective register of the first plane of the first die of the second group into the first data buffer; (a8) while the fifth chunk of data in the first data buffer is transferred to the host according to the predefined data interleaving scheme, loading a sixth chunk of data to respective register of a second plane of the first die of the second group, and then filling the sixth chunk of data from the respective register of the second plane of the first die of the second group into the second data buffer; (a9) while the sixth chunk of data in the second data buffer is transferred to the host according to the predefined data interleaving scheme, loading a seventh chunk of data to respective register of a first plane of a second die of the second group, and then filling the seventh chunk of data from the respective register of the first plane of the second die of the second group into the first data buffer; (a10) while the seventh chunk of data in the first data buffer is transferred to the host according to the predefined data interleaving scheme, loading for an eighth chunk of data to respective register of a second plane of the second die of the second group, and then filling the eighth chunk of data from the respective register of the second plane of the second die of the second group into the second data buffer; (a11) while the eighth chunk of data in the second data buffer is transferred to the host according to the predefined data interleaving scheme, loading a new fifth chunk of data to respective register of the first plane of the first die of the second group; and (a12) repeating steps (a3)-(a10) until said data read request has been fulfilled. According to yet another embodiment of the present invention, a method of data programming/writing operations in high performance flash memory device (FMD) comprises at least the following steps: (b1) receiving a data program request; (b2) filling a first chunk of data into a first data buffer in a predefined data interleaving scheme from a host; (b3) moving the first chunk of data from the first data buffer into respective register of a first plane of a first die of a first group of non-volatile memory chips; (b4) while the first chunk of data is written from the respective register to corresponding location of the non-volatile memory chips, setting read/busy signal of all of the non-volatile memory chips in the first group to busy and filling a second chunk of data into a second data buffer in the predefined data interleaving scheme from the host; (b5) moving the second chunk of data from the second data buffer into respective register of a second plane of the first die of the first group; (b6) while the second chunk of data is written from the respective register to corresponding location of the non-volatile memory chips, setting read/busy signal of all of the non-volatile memory chips in the first group to busy and filling a third chunk of data into the first data buffer in the predefined data interleaving scheme from the host; (b7) moving the third chunk of data from the first data buffer into respective register of a first plane of a second die of the first group; (b8) while the third chunk of data is written from the respective register to corresponding location of the non-volatile memory chips, setting read/busy signal of all of the non-volatile memory chips in the first group to busy and filling a fourth chunk of data into the second data buffer in the predefined data interleaving scheme from the host; (b9) while the fourth chunk of data is written from the respective register to corresponding location of the non-volatile memory chips, setting read/busy signal of all of the non-volatile memory chips in the first group to busy and filling a fifth chunk of data into the first data buffer in the predefined data interleaving scheme from the host; (b10) moving the fifth chunk of data from the first data buffer into respective register of a first plane of a first die of a second group; (b11) while the fifth chunk of data is written from the respective register to corresponding location of the non-volatile memory chips, setting read/busy signal of all of the non-volatile memory chips in the second group to busy and filling a sixth chunk of data into the second data buffer in the predefined data interleaving scheme from the host; (b12) moving the sixth chunk of data from the second data buffer into respective register of a second plane of the first die of the second group; (b13) while the sixth chunk of data is written from the respective register to corresponding location of the non-volatile memory chips, setting read/busy signal of all of the non-volatile memory chips in the second group to busy and filling a seventh chunk of data into the first data buffer in the predefined data interleaving scheme from the host; (b14) moving the seventh chunk of data from the first data buffer into respective register of a first plane of a second die of the second group; (b15) while the seventh chunk of data is written from the respective register to corresponding location of the non-volatile memory chips, setting read/busy signal of all of the non-volatile memory chips in the second group to busy and filling an eighth chunk of data into the second data buffer in the predefined data interleaving scheme from the host; (b16) moving the eighth chunk of data from the second data buffer into respective register of a second plane of the second die of the second group; (b17) while the eighth chunk of data is written from the respective register to corresponding location of the non-volatile memory chips, setting read/busy signal of all of the non-volatile memory chips in the second group to busy and filling a new first chunk of data into the first data buffer if required; and (b18) repeating steps (b3)-(b17) until the data programming request has been fulfilled.

One of the objects, features, and advantages in the present invention is that a high performance FMD enables high performance data transfer thus allowing a host computing device uses the FMD as secondary storage without sacrificing performance. Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIGS. 10A-10C collectively is a flowchart illustrating an exemplary process of data programming/writing operation in the high performance FMD controller of FIG. 2, according to an embodiment of the present invention; and FIGS. 10D-10F collectively is a flowchart illustrating an exemplary process of data reading operation in the high performance FMD controller of FIG. 2, according to an embodiment of the present invention.

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Used herein, the terms "upper", "lower", "top", "bottom", "middle", "upwards", and "downwards" are intended to provide relative positions for the purposes of description, and are not intended to designate an absolute frame of reference. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-9B. However, those skilled in the art will readily appreciate that the detailed description given herein with respect to these figures is for explanatory purposes as the invention extends beyond these limited embodiments.

Figure 1A:
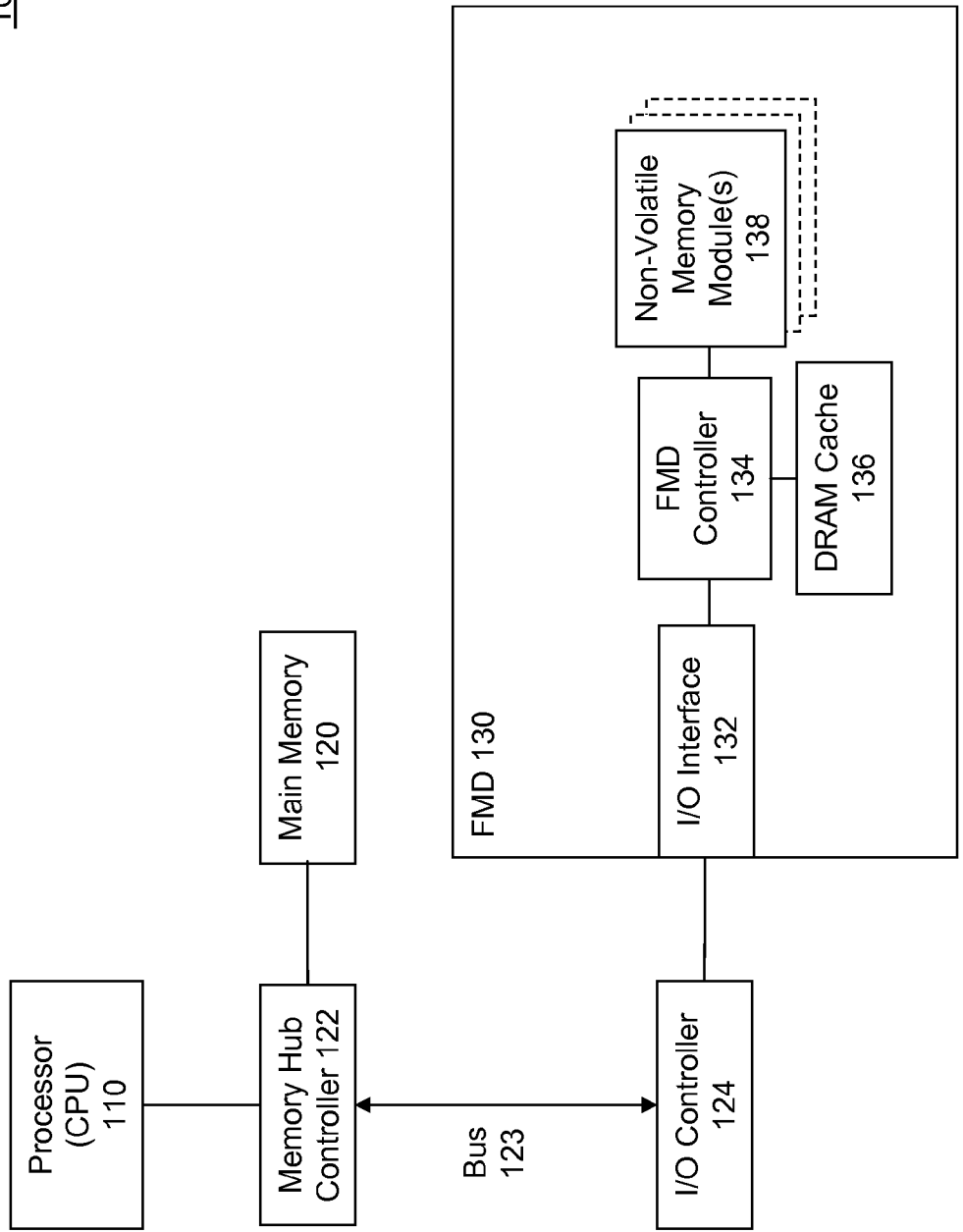
FIG. 1A is a simplified block diagram showing salient components of a computer system including an exemplary high performance flash memory device (FMD) in accordance with one embodiment of the presented invention.

Referring now to the drawings, FIG. 1A is a functional block diagram showing salient components of a first exemplary computer system 100, in which an exemplary high performance flash memory device (FMD) 130 may be deployed as a secondary storage in accordance with one embodiment of the present invention. The first computer system 100 comprises at least one microprocessor or central processing unit (CPU) 110, a memory hub controller 122, a main memory 120 (e.g., random access memory (RAM)), and an input/output (I/O) controller 124 along with a secondary storage (e.g., the high performance flash memory device (FMD) 130). An internal communication or data bus 123 is also included in the computer system 100 to provide internal data and control signal communications between the memory hub controller 122 and the I/O controller 124. The memory hub controller 122 (e.g., a Northbridge controller) is configured to handle internal communications between the processor 110, the main memory 120, and the I/O controller 124 (e.g., a Southbridge controller). The internal communication bus 123 may comprise a Peripheral Component Interconnect Express (PCI-E) bus.

The exemplary high performance FMD 130 comprises an I/O interface 132, a FMD controller 134, a cache 136 (e.g., Dynamic Random Memory (DRAM) cache) and at least one non-volatile memory module 138. The I/O interface 132 ensures that the host computer system 100 can communicate with the at least one non-volatile memory module 138 through one of the industry standards including, but not limited to, Advanced Technology Attachment (ATA) or Parallel ATA (PATA), Serial ATA (SATA), Small Computer System Interface (SCSI), Universal Serial Bus (USB). The FMD controller 134 is configured to control data transfer between the host computer system 100 and the at least one non-volatile memory module 138. The data transfer includes data reading, writing (also known as programming) and erasing. The DRAM cache 136 is configured as a cache or buffer for the FMD controller 134 such that the data reading and writing operations could be more efficient especially for the at least one-volatile memory module 138 made of Multi-Level Cell (MLC) flash memory. For example, each page of the MLC flash memory can only be programmed once, when two different write requests for two pages located within a same page still require two write operations in two different pages. With the aid of the DRAM cache 136, partially written page may be cached so that two sectors can be rearrange in the DRAM cache 136 before being written to the MLC flash memory.

Each of the at least one non-volatile memory module 130 may include at least one non-volatile memory chip (i.e., integrated circuit). Each chip includes at least two planes of flash cells or arrays. Each plane comprising an independent register is configured to accommodate parallel data transfer operations. Each plane of the non-volatile memory chip is arranged in a data structure as follows: Each of the chips is divided into a plurality of data blocks and each block is then partitioned into a plurality of data pages. Each of the pages may contain one or more addressable data sectors. The data erasing in the non-volatile memory is perform in a data block by data block basis, while the data reading and writing can be performed for each data sector. The data register is generally configured to hold one page of data. The non-volatile memory may include, but not be limited to, flash memory, and phase-change memory. In order to achieve high performance such as the level of Ultra-DMA, the performance FMD 130 needs to perform data transfer in parallel with a specific data interleaving scheme. Details of data interleaving schemes and parallel data transfer are shown and described in FIGS. 8A-9B and the corresponding descriptions thereof.

Figure 1B:
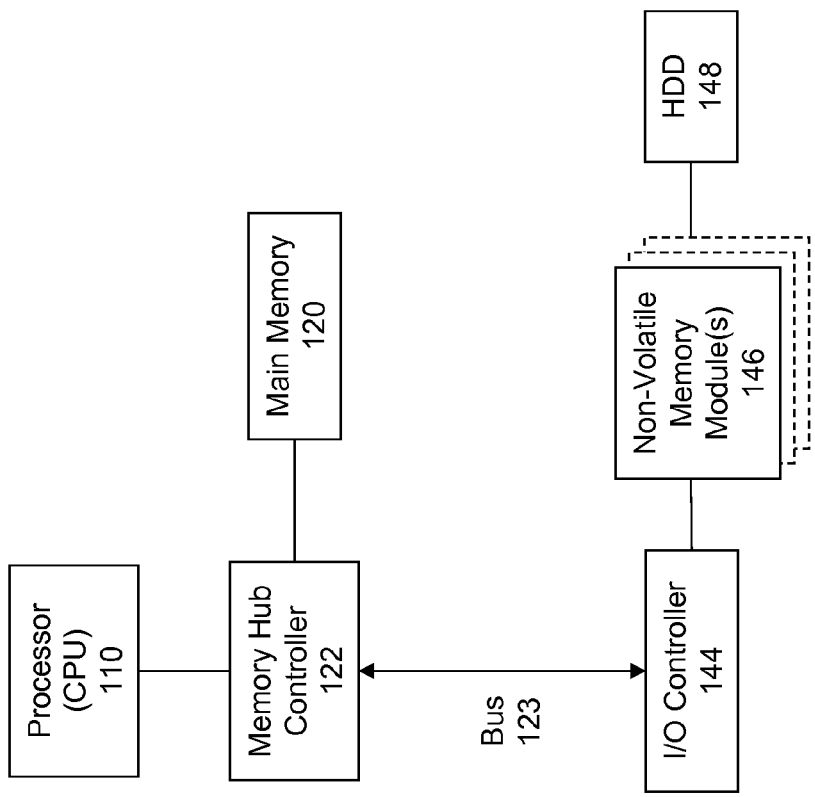
FIG. 1B is a simplified block diagram showing salient components of computer system of FIG. 1A with another exemplary high performance flash memory device (FMD) in accordance with one embodiment of the presented invention.

FIG. 1B shows a second computer system 140 in which at least one non-volatile memory module is used in conjunction with hard disk drives as a secondary storage, according to an embodiment of the present invention. Most of the components of the second computer system 140 are the same as those of the first computer system 100 except the second computer system 140 includes one or more hard disk drives (HDD) 148. The at least non-volatile memory module 146 is configured as a front end buffer to the HDD 148, such that data transfer can be performed more efficient. In this embodiment, the at least one non-volatile memory module 146 is controlled by the I/O controller 144.

Figure 1C:
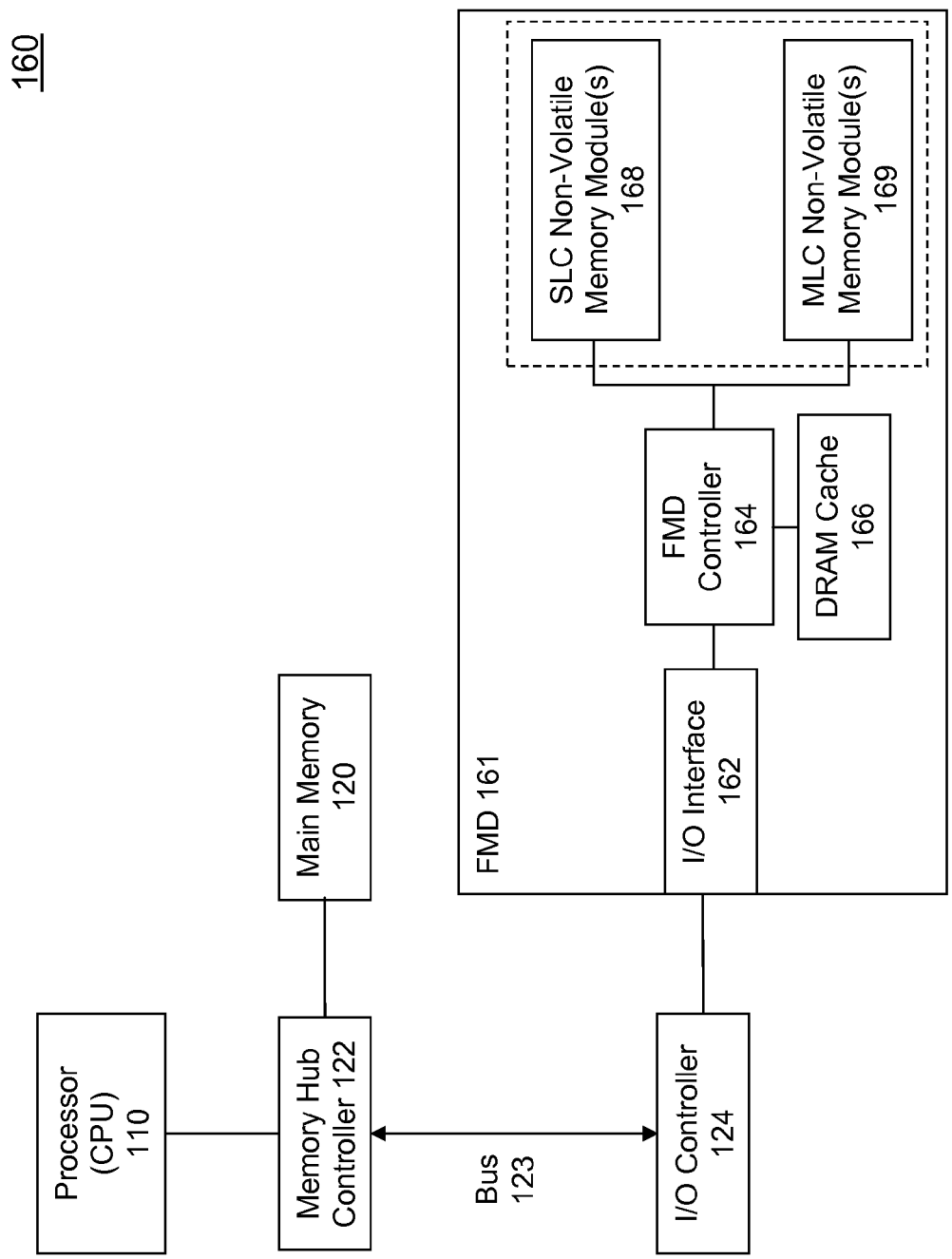
FIG. 1C is a simplified block diagram showing salient components of the computer system of FIG. 1A with yet another exemplary high performance hybrid flash memory device (FMD) in accordance with one embodiment of the present invention.

Shown in FIG. 1C is a third computer system 160, which comprises substantially similar components as the first computer system 100 except a hybrid flash memory device (FMD) 161. The hybrid FMD 161 includes an I/O controller 162, a FMD controller 164, a DRAM cache 166 and at least one non-volatile memory modules including both Single-Level Cell (SLC) non-volatile memory modules 168 and Multi-Level Cell (MLC) non-volatile memory modules 169. The SLC non-volatile memory modules 168 are configured to store more frequent accessed data, while the MLC non-volatile memory modules 169 are configured to store less accessed data. More details how to make and use of the hybrid FMD 161 can be found in an inventors' co-pending U.S. patent application Ser. No. 11/926,743 filed on Oct. 29, 2007, the entire content of which is incorporated herein by reference.

Figure 1D:
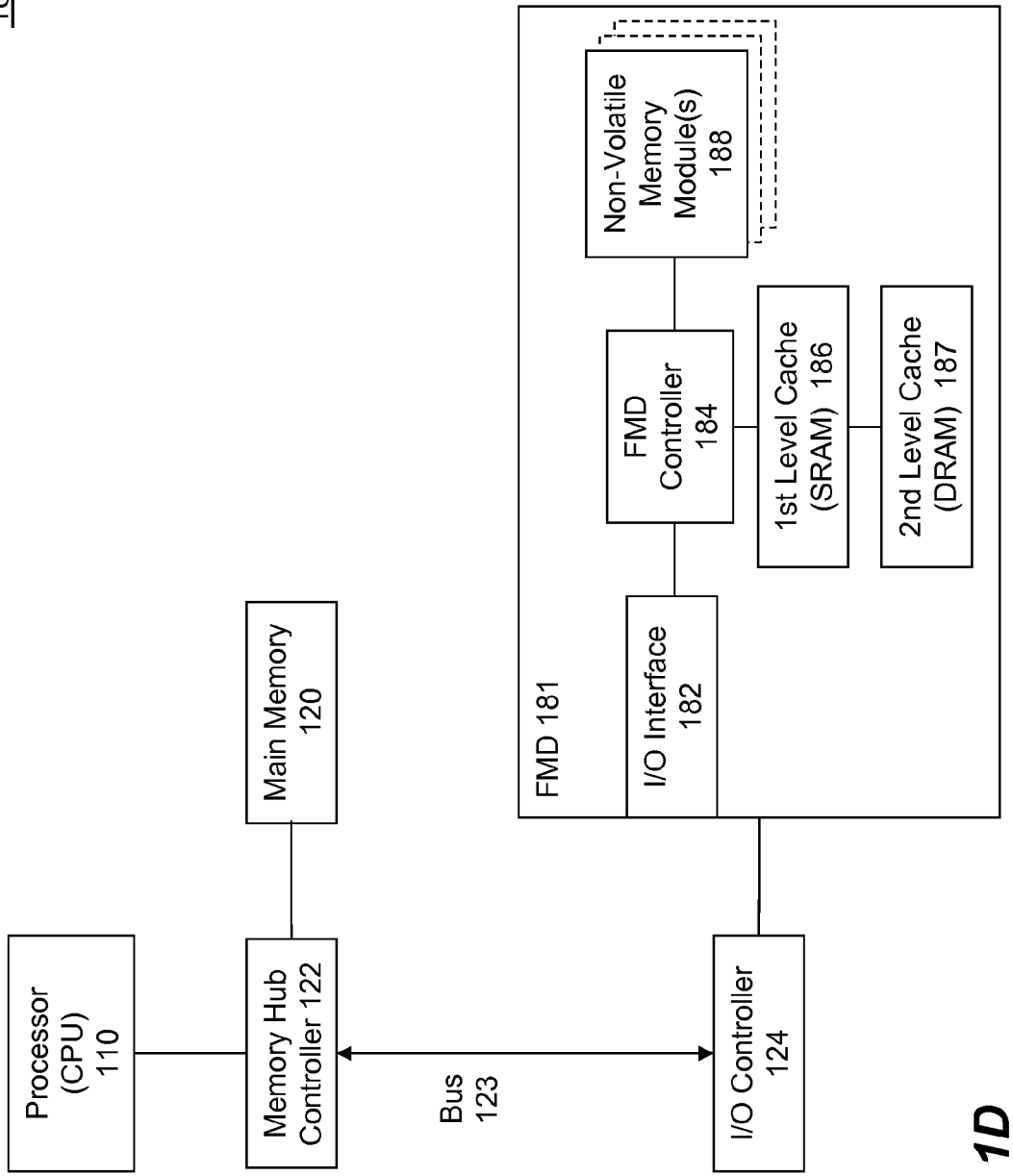
FIG. 1D is a simplified block diagram showing salient components of the computer system of FIG. 1A with yet another exemplary high performance flash memory device (FMD) with hierarchical cache in accordance with one embodiment of the present invention.

FIG. 1D shows a fourth computer system 180. Again, the fourth computer system 180 comprises substantially similar components comparing to those of the first computer system 100 except a multi-level cache FMD 181. The multi-level FMD 181 includes an I/O interface 182, a FMD controller 184, a first level cache 186 (e.g., a static RAM (SRAM) cache), a second level cache 187 (e.g., a DRAM cache) and at least one non-volatile memory modules 188 (e.g., phase change memory, SLC flash memory, MLC flash memory, etc.). The first level cache 186 is generally made of faster memory (e.g., SRAM) with a smaller capacity due to the costs and other concerns, while the second level cache 187 is made of relatively slower memory (e.g., DRAM) with a relatively larger capacity.

Figure 1E:
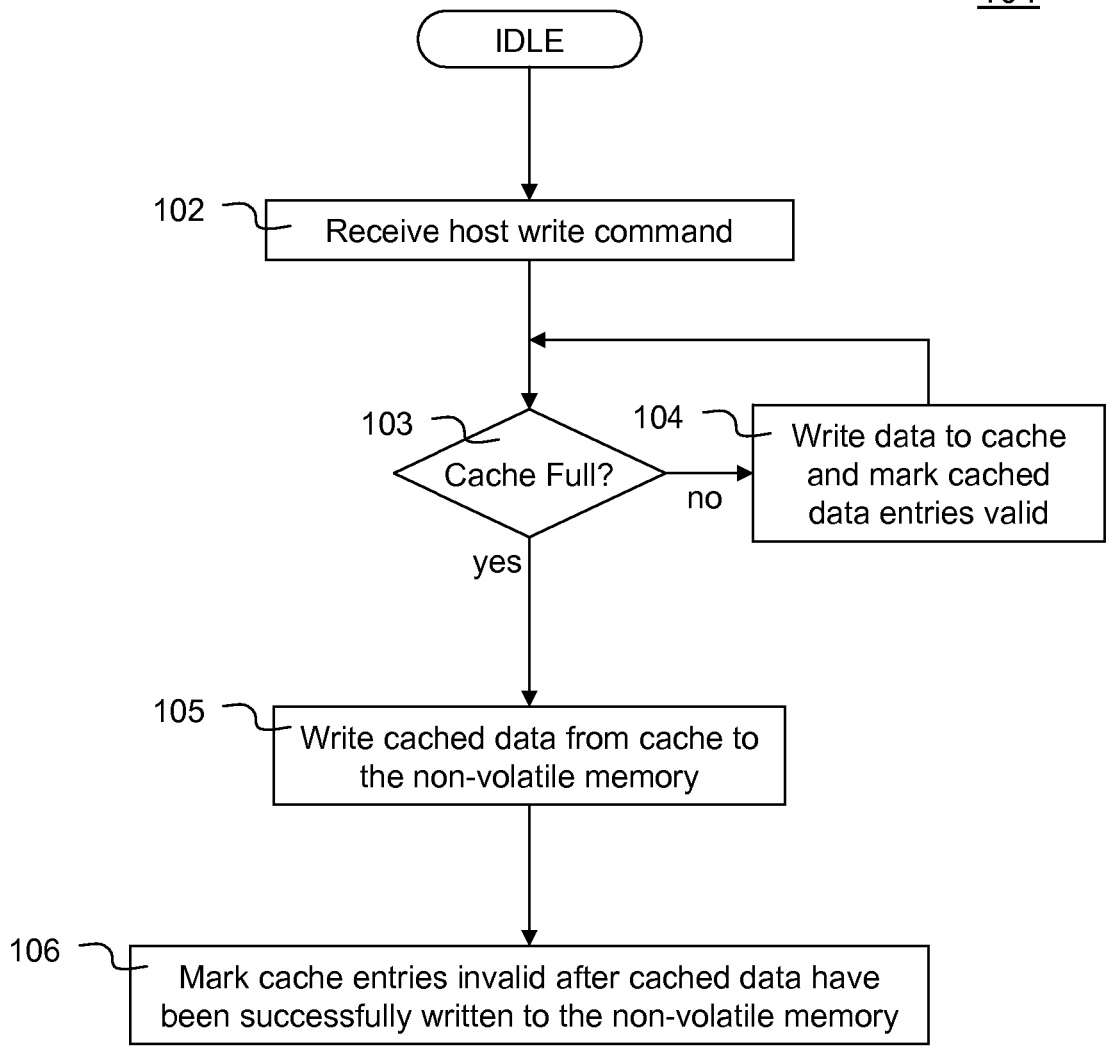
FIG. 1E is a flowchart illustrating an exemplary process of writing data from a host to the FMD of FIG. 1A in accordance with one embodiment of the present invention.

FIG. 1E is a flowchart illustrating an exemplary process 101 of writing data from a host to the FMD 100 of FIG. 1A in accordance with one embodiment of the present invention. The host may be a computing device or a consumer electronic device. The process 101 starts at an "IDLE" state until a data write command is received at 102. The data write command may include operation code, starting sector address and number of sectors to be transferred from the host to the FMD 100. Next, at decision 103, it is determined whether DRAM cache 136 is full. If 'no', the process 101 writes the data into the DRAM cache 136 and waiting for another data writing command at 104. Otherwise, if the decision 103 is 'yes', the process 101 writes cached data into the non-volatile memory at 105 and mark cache data as invalid after confirming the data have been successfully written to the non-volatile memory at 106.

An exemplary data structure of the DRAM cache 136 is shown in Table 1 as follows:

TABLE 1

| TAG/Address | Sector Data | Flag (Valid/Invalid) |
| --- | --- | --- |
|  |  |  |

TAG/address is for the location of the data, sector data is the data to be written. Initially the flag for all entries in the DRAM cache 136 are set to invalid, so that new data are allowed to be written into. Once a data entry is made to the DRAM cache 136, the flag is set to valid, which prevents new data overwriting. When the cached data have been written to the non-volatile memory successfully, the flag is again changed to invalid. To implement the data validity flag, a toggle bit may be used, for example, 0 represents invalid (i.e., allowed to be written into) and 1 represents valid (i.e., data is valid).

Figure 1F:
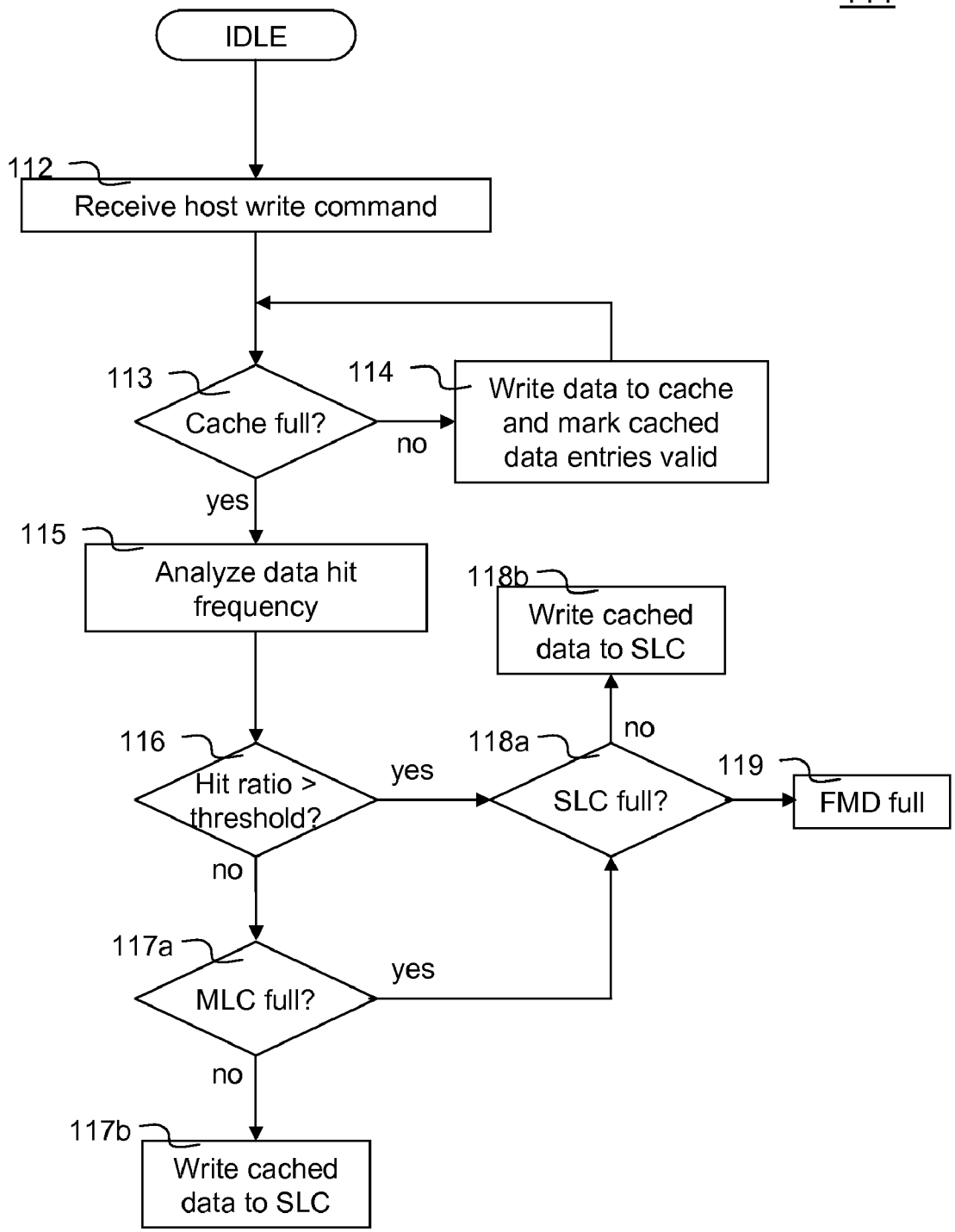
FIG. 1F is a flowchart illustrating a first exemplary process of writing data from a host to the hybrid FMD of FIG. 1C in accordance with one embodiment of the present invention.

FIG. 1F is a flowchart illustrating a first exemplary process 111 of writing data from a host to the hybrid FMD 161 of FIG. 1C in accordance with one embodiment of the present invention. The process 111 starts at an 'IDLE' state until a data write command is received from the host at 112. Then the process 111 moves to a decision 113, it is determined whether the DRAM cache 166 is full. If 'no', the process 111 writes the data into the DRAM cache at 114 and moves back for another data. If 'yes', the process 111 analyzes the data hit rate/frequency for the cached data at 115. Next, at decision 116, the data with hit rate ratio larger than a predefined threshold are marked to be written to the SLC non-volatile memory 168. If the SLC memory is not full or 'no' at the decision 118a, the data is written to the SLC 168 at 118b. Otherwise, disk full message is sent back to the host at 119.

Referring back to decision 116, if the hit rate is lower than the predefine threshold, the process 111 moves another test 117a. It is determined whether the MLC non-volatile memory 169 is full or not. If 'no', the data is written to the MLC 169 at 117b. If 'yes', the process 111 moves to decision 118a to determine if the data can be written to the SLC 168. If not, the FMD full message is sent back to the host at 119. An exemplary data structure of the DRAM cache 166 is shown in Table 2 as follows:

TABLE 2

| TAG/Address | Hit Counter | Sector Data |
| --- | --- | --- |
|  |  |  |

Figure 1G:
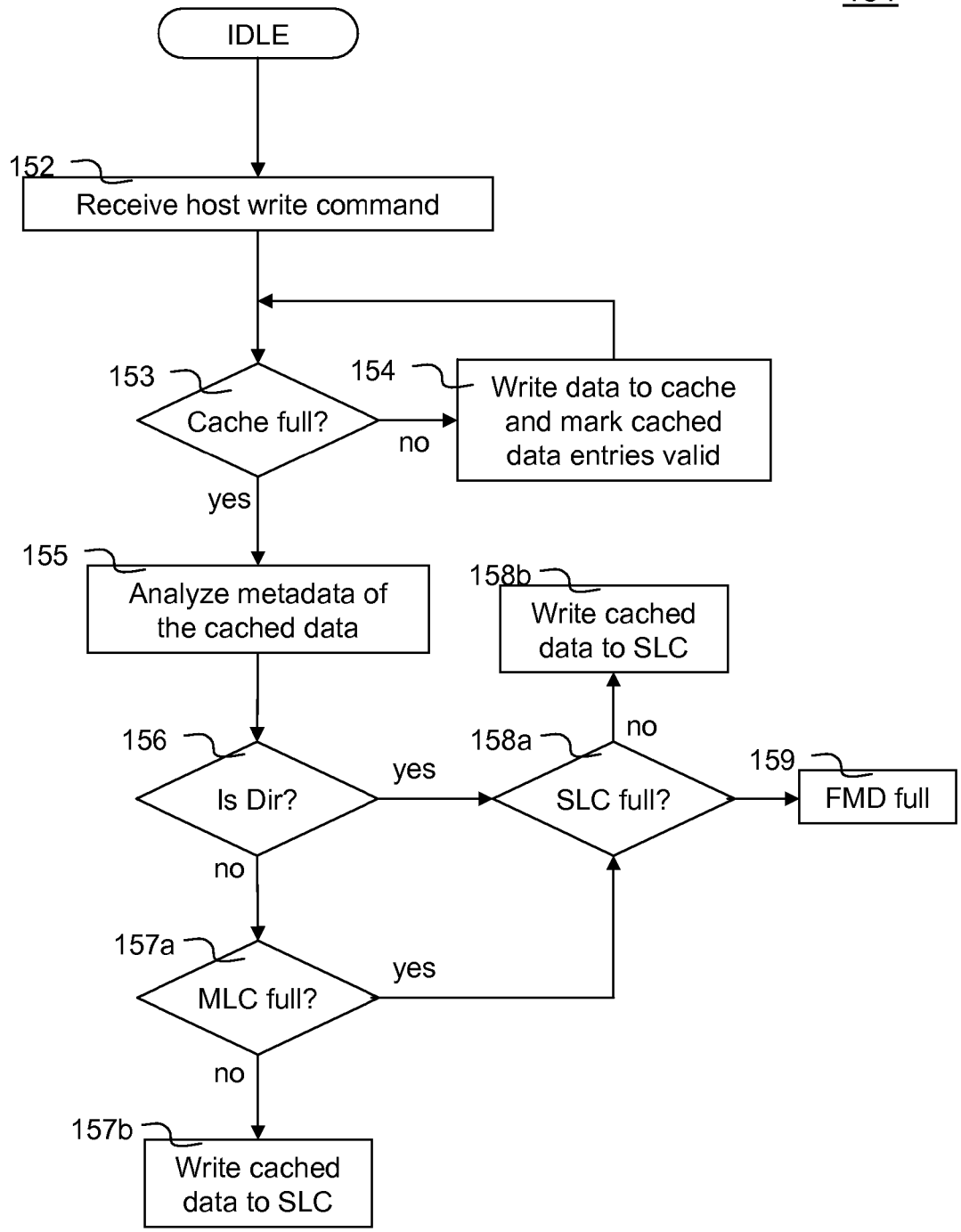
FIG. 1G is a flowchart illustrating a second exemplary process of writing data from a host to the hybrid FMD of FIG. 1C in accordance with one embodiment of the present invention.

FIG. 1G is a flowchart illustrating a second exemplary process 151 of writing data from a host to the hybrid FMD 161 of FIG. 1C in accordance with one embodiment of the present invention. The process 151 is very similar to the process 111. Instead of using data hit rate, process 151 uses file structure to determine whether the data is written to the SLC 168 or the MLC 169. For example, step 155 and decision 156 are used to check the data structure, directories and certain important files (e.g., master boot record) are stored in the SLC 168. Others are stored in the MLC 169. An exemplary data structure of the DRAM cache 166 is shown in Table 3 as follows:

TABLE 3

| TAG/Address | File Structure Information | Sector Data |
| --- | --- | --- |
|  |  |  |

Figure 1H:
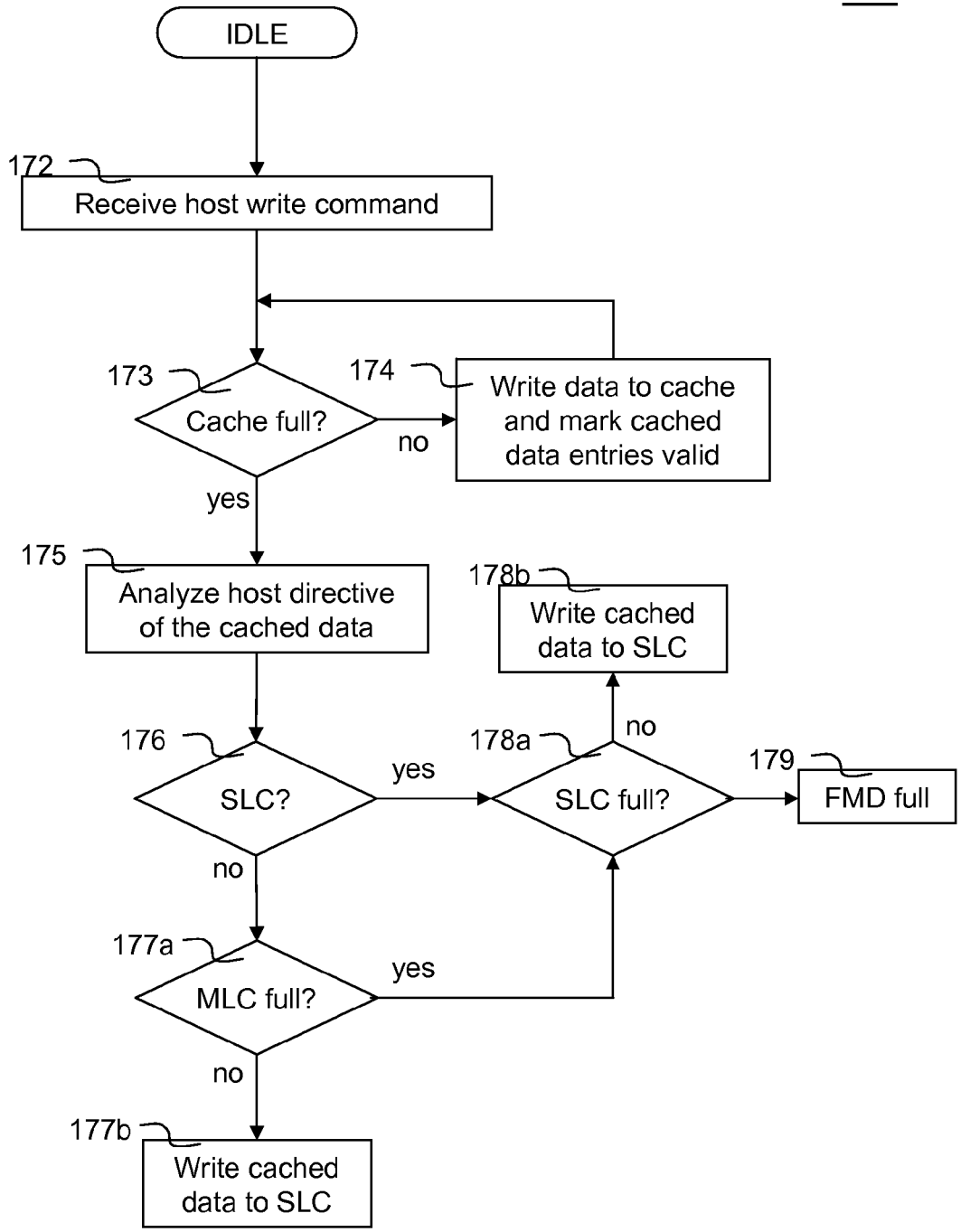
FIG. 1H is a flowchart illustrating a third exemplary process of writing data from a host to the hybrid FMD of FIG. 1C in accordance with one embodiment of the present invention.

FIG. 1H is a flowchart illustrating a third exemplary process 171 of writing data from a host to the hybrid FMD 161 of FIG. 1C in accordance with one embodiment of the present invention. The process 171 is again very similar to the processes 111 and 151. The differences are in step 175 and decision 176. Host directives are determined and checked at 175 and 176 to decide whether the data to be written to the SLC 168 or the MLC 169. An exemplary data structure of the DRAM cache 166 is shown in Table 4 as follows:

TABLE 4

| TAG/Address | Host Command | # of Transfers | Sector Data |
| --- | --- | --- | --- |
|  |  |  |  |

Host command (CMD) is used for providing directive as to whether the data toe be written to the SLC or the MLC. Number of transfers is referred to the number of sectors to be transferred.

Figure 1I:
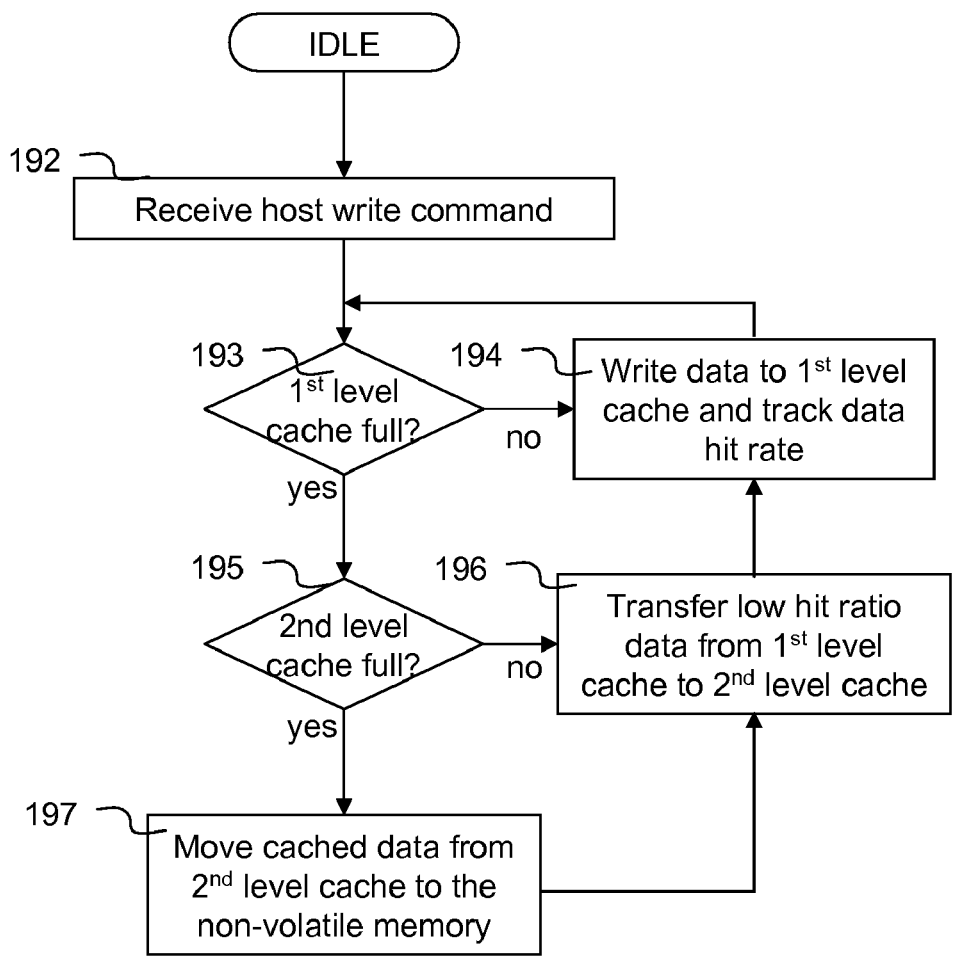
FIG. 1I is a flowchart illustrating an exemplary process of writing data from a host to the FMD with hierarchical cache of FIG. 1D in accordance with one embodiment of the present invention.

FIG. 1I is a flowchart illustrating an exemplary process 191 of writing data from a host to the FMD 181 with hierarchical cache of FIG. 1D in accordance with one embodiment of the present invention. The process 191 starts at an 'IDLE' state until a data write command is received at 192. Next, the process 191 moves to a decision 193. It is determined if the first level cache 186 is full. If 'no', at 194, the process 191 writes the data entry into the first level cache 186, track data hit rate and returns to the 'IDLE' state for next data or command. If 'yes', the process 191 moves to another decision 195. It is determined whether the second level cache 187 is full or not. If 'no' or not full, the process 191 moves low hit rate data from the first level cache 186 into the second level cache 187 at 196. Then the process 191 writes data into the first level cache 186 at 194, track data hit rate and returns to the "IDLE" state for another data. Otherwise, the process 191 moves data from the second level cache 187 to the non-volatile memory 188 so that there is room in the hierarchical caches for further data write operations.

Respective exemplary data structures of the first 186 and second 187 level caches) are shown in Tables 5 and 6 as follows:

TABLE 5

| TAG/Address | Hit Counter | Sector Data |
|---|---|---|
| | | |

TABLE 6

| TAG/Address | # of Transfers | Sector Data |
|---|---|---|
| | | |

Figure 2:
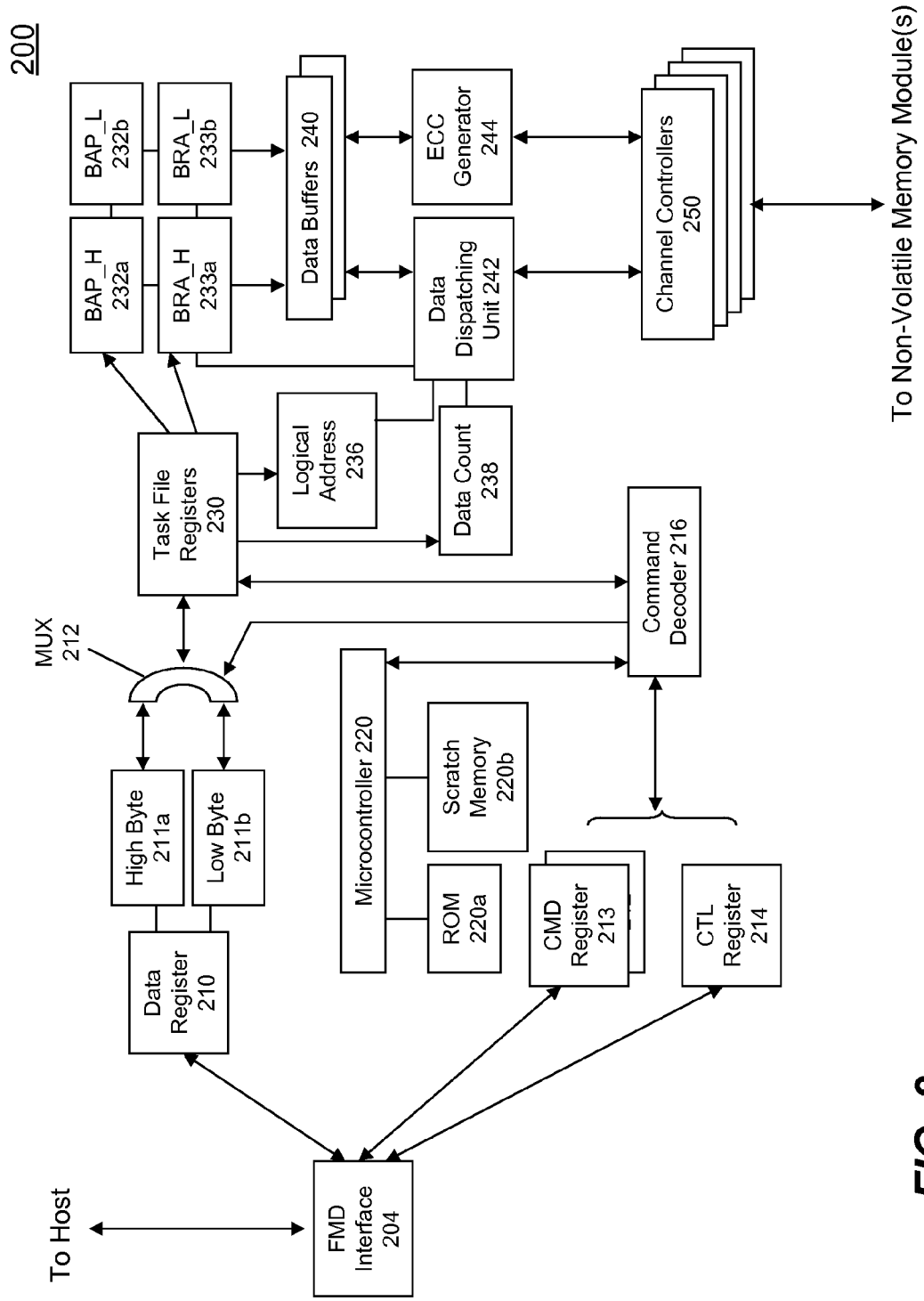
FIG. 2 is a functional block diagram depicting an exemplary high performance flash memory device controller in accordance with one embodiment of the present invention.

FIG. 2 is a block diagram illustrating an exemplary FMD controller (e.g., FMD controller 134 of FIG. 1A) in accordance with one embodiment of the present invention. The FMD controller 200 comprises a FMD interface 204, a data register 210, one or more command (CMD) registers 213, a control (CTL) register 214, a multiplexer (MUX) 212, a microcontroller 220 (e.g., a 8051 microcontroller), a command decoder 216, task file registers 230, a set of parallel data buffers 240 (e.g., a pair of data buffers), a data dispatching unit 242, an error correction code (ECC) generator 244 and a plurality of channel controllers 250. The FMD interface 204 is configured to provide data, command and control signals interface to and from a host (e.g., the first 100 computer system of FIG. 1A). When the data register 210 is sized to hold two-byte of data (i.e., high and low bytes), the high byte and low byte are separated in a high byte filter 211a and a low byte filter 211b. The high byte and the low byte are multiplexed together in a multiplexer 212 for data to be written to the FMD. For data to be read or retrieved from the FMD, the data flow is reversed, the data register 210 is filled with high and low bytes of the data from the multiplexer 212.

Figure 4:
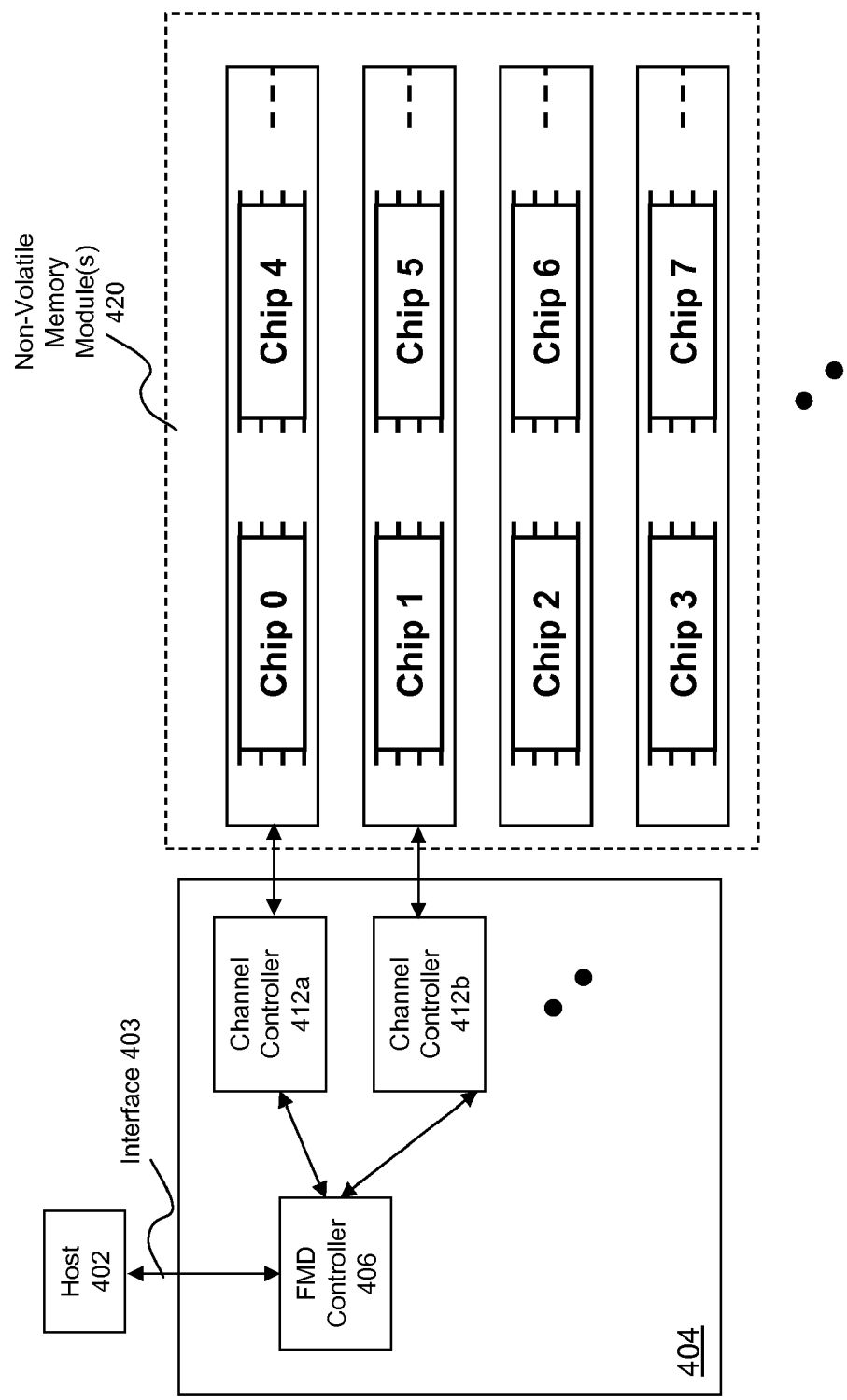
FIG. 4 is a diagram depicting a first exemplary implementation of high performance FMD in accordance with one embodiment of the present invention.
Figure 5:
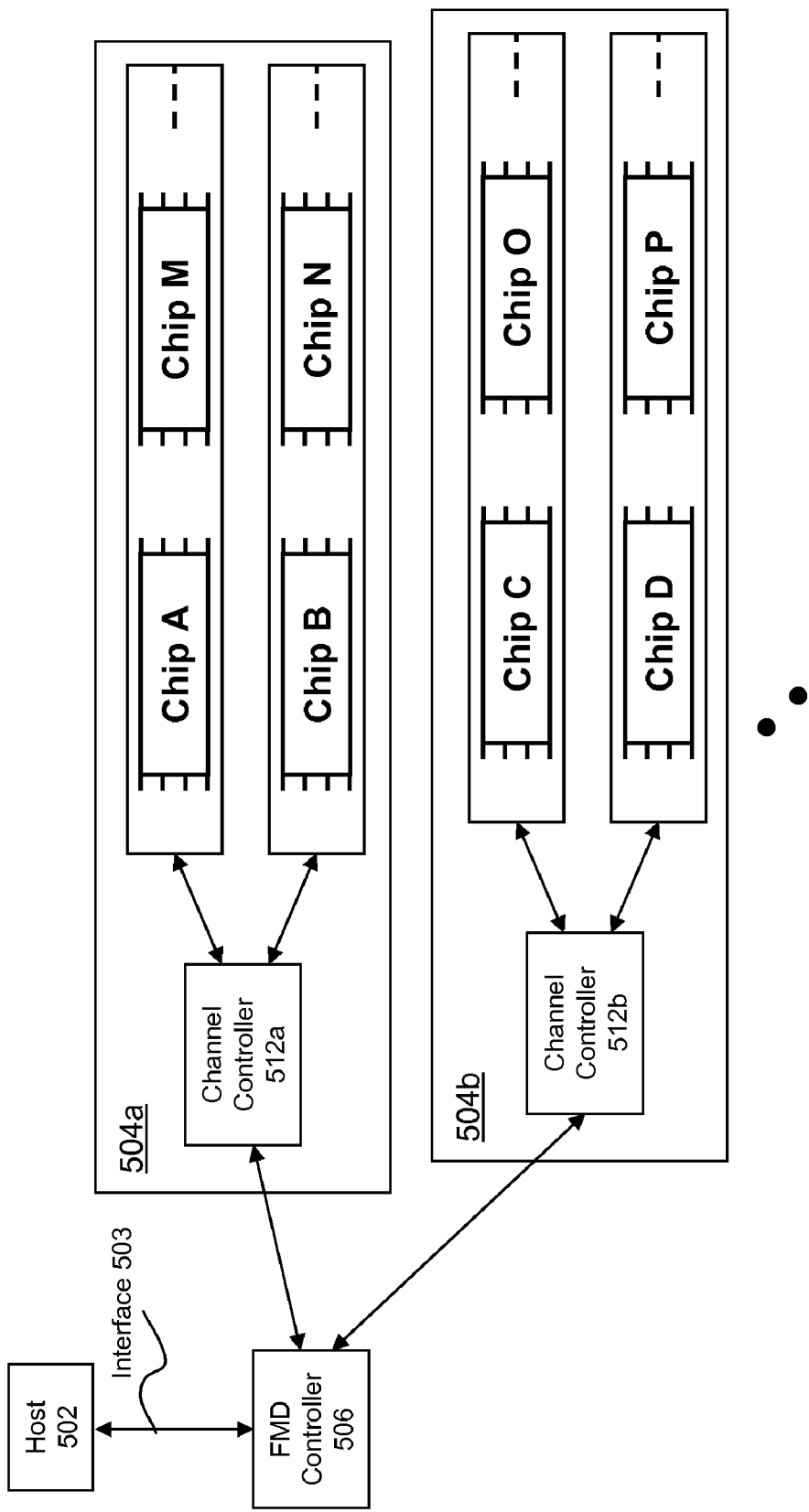
FIG. 5 is a diagram depicting a second exemplary implementation of high performance FMD in accordance with one embodiment of the present invention.

The command decoder 216 is configured to decode commands and control signals received in the CMD registers 213 and the CTL register 214, respectively. The decoded commands and control signals are sent to the multiplexer 212 before sending to the task file registers 230. The command decoder 216 is also configured to communicate with the microprocessor 220 and the task file registers. The microcontroller 220 further includes a read-only memory (ROM) 220a and a scratch memory 220b (e.g., a random access memory (RAM)). The ROM 220a is configured to store modules (e.g., firmware) to be executed by the microprocessor 220. The scratch memory 220b is configured as a main memory space when one of the modules is executed in the microcontroller 220. The task file registers 230 is configured to extract decoded data, command and control signals. The extracted data include, but is not necessarily limited to, logical address 236 (e.g., logical block address (LBA) or logical sector address (LSA)), data count 238, buffer address pointer (i.e., BAP_H 232a high byte of the pointer and BAP_L 232b low byte of the pointer) and corresponding data (i.e., BRA_H 233a high byte of the data and BRA_L 233b low byte of the data). The data dispatching unit 242 uses the extracted data (i.e., the buffer address pointer and the corresponding data) to fill the set of parallel data buffers 240 in a specific interleaving scheme. The ECC generator 244 is configured to generate ECC for the filled data in the data buffers 240 before being written to the at least one non-volatile memory module. The channel controllers 250 is configured to transmit data between the set of data buffers 240 and the at least one non-volatile memory module in a most efficient manner. In one embodiment, the channel controllers 250 are integrated within the FMD controller 200 as shown in FIG. 4. In another embodiment, the channel controllers 250 are integrated with the non-volatile memory modules as shown in FIG. 5.

Figure 3A:
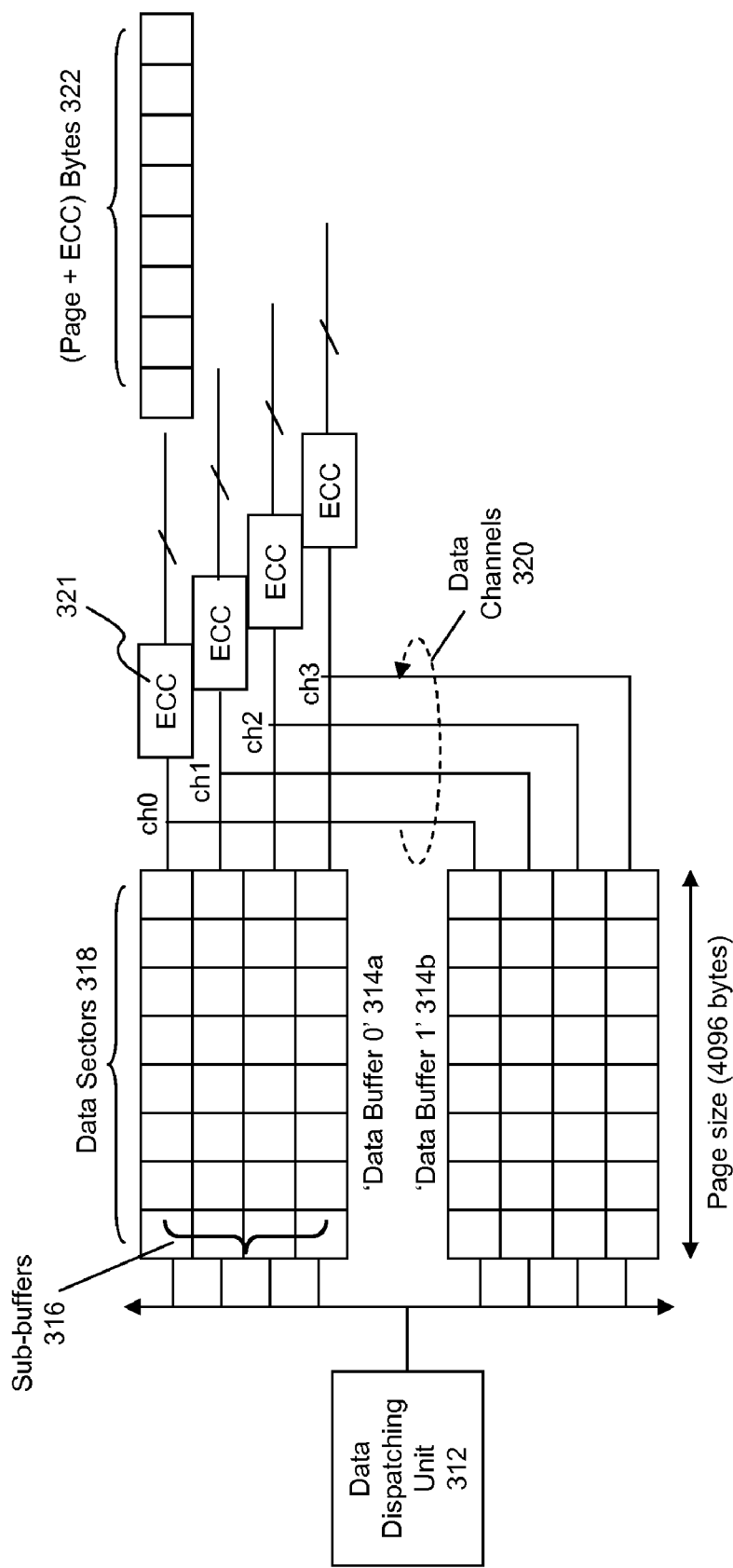
FIGS. 3A-3C are schematic diagrams showing exemplary error correction code (ECC) data structures used in data buffers of the FMD controller of FIG. 2, according to an embodiment of the present invention.
Figure 3B:
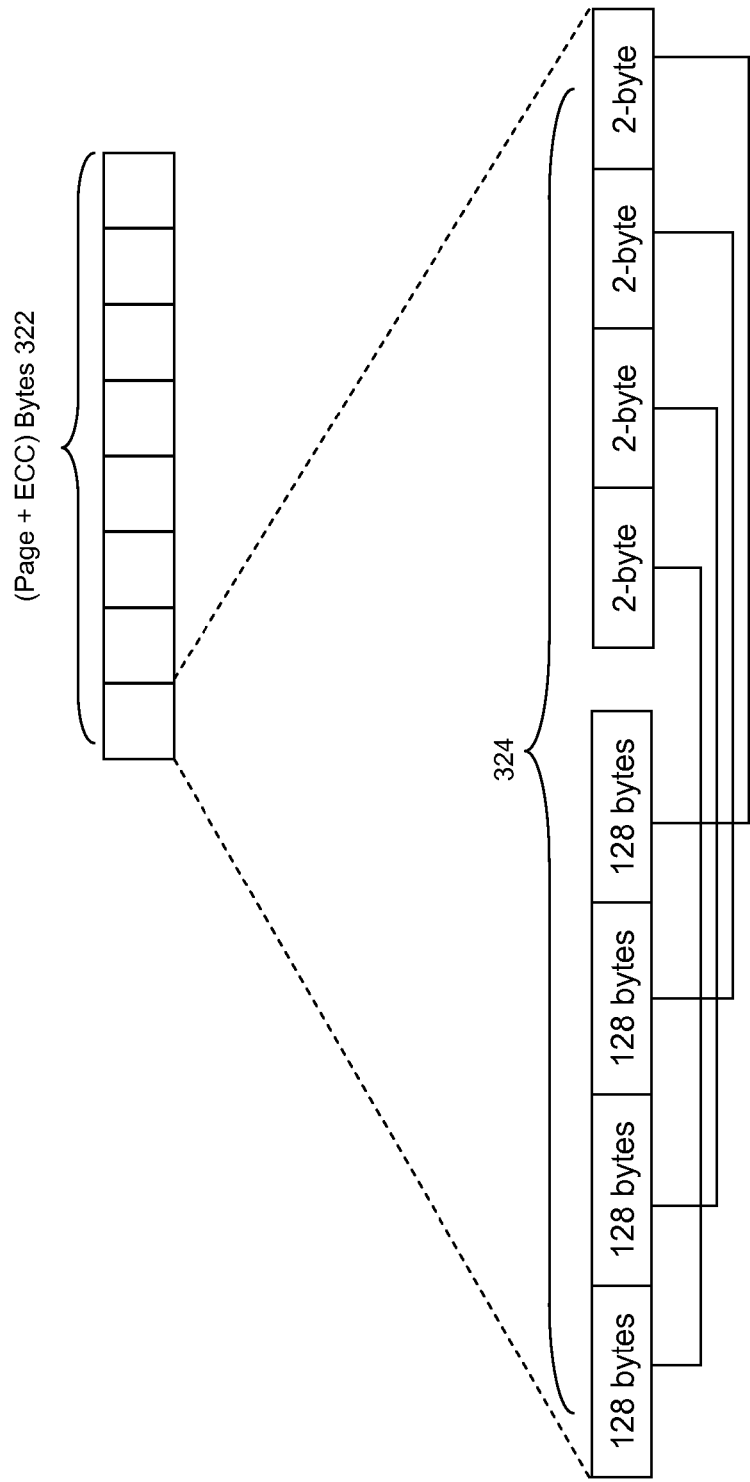

In order to increase data reliability, data stored on the at least one non-volatile memory module are protected using certain error correction techniques. One of the error correction techniques is referred to as ECC (either "error correction (or correcting) code" or "error checking and correcting". There are many types of ECC. In general, a code (i.e., an ECC) is first created for original data (e.g., filled data in the data buffers before being written or programmed) using one of the ECC algorithms (e.g., Reed-Solomon, Hamming, Reed-Muller, Binary Golay, BCH (Bose, Ray-Chaudhuri, Hocquenghem), etc.). Later, during a data reading or retrieval, the code is used for reconstructing the original data if any error is detected. FIG. 3A is a schematic diagram showing an exemplary ECC data structure used in the set of parallel data buffers of the FMD controller of FIG. 2, according to an embodiment of the present invention.

In a data writing operation, a data dispatching unit 312 (i.e., the data dispatching unit 242 of FIG. 2) fills data to a set of parallel data buffers (e.g., 'data buffer 0' 314a and 'data buffer 1' 314b). Each of the data buffers is divided into a plurality of sub-buffers 316 (e.g., four shown). Each of the sub-buffers has a size equal to page size (e.g., 4096 bytes in this example) of the non-volatile memory chip. And each sub-buffer may be further partitioned into one or more data sectors 318 (e.g., eight shown). Respective sub-buffers are connected to one of corresponding data channels 320 (e.g., four channels ch0, ch1, ch2, ch3). For example, a first pair of sub-buffers (i.e., first sub-buffer from 'data buffer 0' 314a and first sub-buffer from 'data buffer 1' 314b) is connected to first data channel (ch0).

Figure 3C:
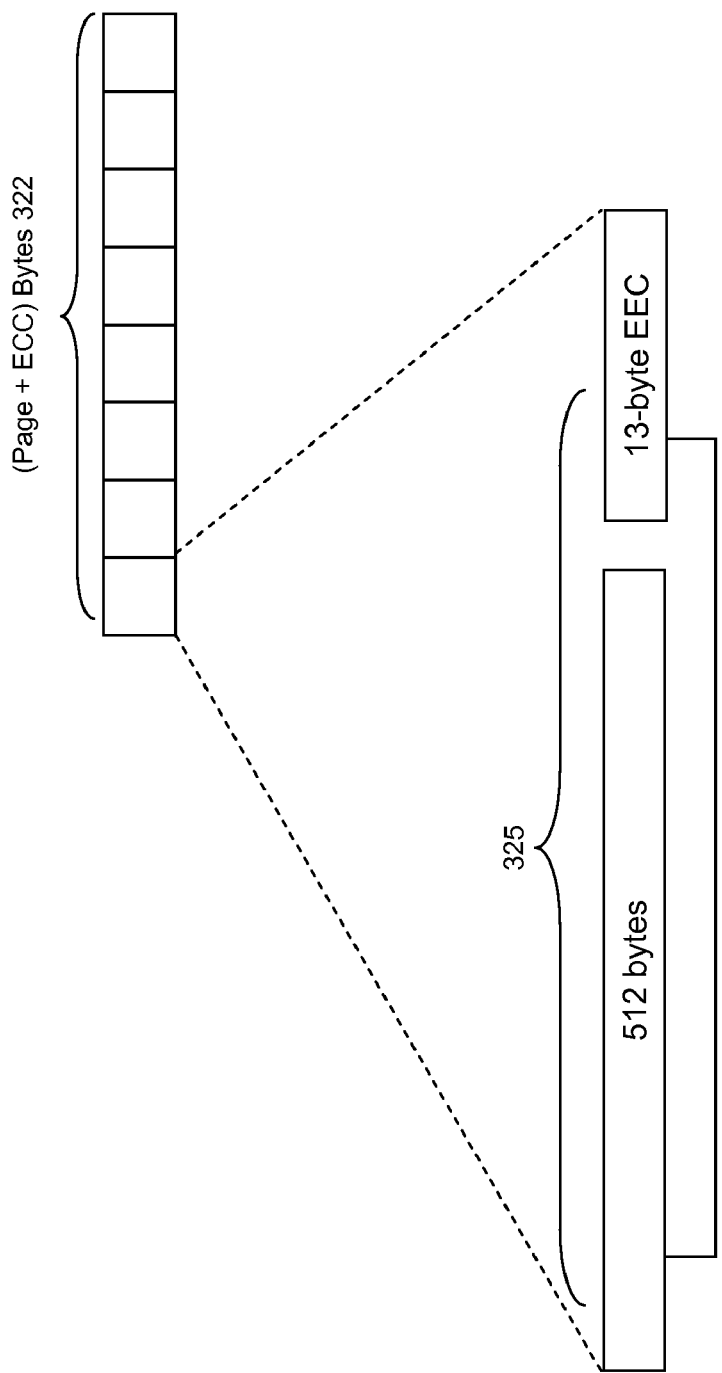

An error correction code or ECC 321 is generated for original data in each of the sub-buffers 316 with an ECC generator (i.e., ECC generator 244 of FIG. 2). The generated ECC 321 is appended to the original data as an ECC page 322 (i.e., a data segment containing (Page+ECC) bytes) and written to a register in one of the planes of a non-volatile memory chip in the at least one non-volatile memory module. In the example shown in FIG. 3A, there are eight data sectors 318 per sub-buffer 316. Each sub-buffer 316 contains 4096 bytes of data hence 512 bytes for each data sector 318. Shown in FIG. 3B, a blown-up view 324 is a 512-byte data sector is further divided into four 128-byte data segments; each 128-byte data segment requires a 2-byte ECC. As a result, storing a 4096-byte of data needs 4160 (i.e., 4096+64) bytes of physical memory to hold the 4096-byte page and corresponding ECC. In other embodiments, different types of ECC may be used; storage requirements may vary. For example, FIG. 3C is another blown-up view 325 illustrating a 13-byte ECC based on BCH is used for a 512-byte data sector.

FIG. 4 is diagram depicting a first exemplary implementation of high performance FMD in accordance with an embodiment of the present invention. One advantage of the first exemplary implementation is to include all of the functionalities of the high performance FMD into one single chip or integrated circuit 404.

The single chip 404 is configured to control data transfer between a host 402 (e.g., a host computing system) and at least one non-volatile memory module 420. The host 402 may comprise a server computer, a client computer, a desktop computer, a laptop computer, a consumer electronic device, or any other electronic device requiring storage. The at least one non-volatile memory module 420 comprises one or more non-volatile memory (e.g., flash memory) chips. For example, shown in FIG. 4, there are eight chips (i.e., 'Chip 0', 'Chip 1', 'Chip 2', 'Chip 3', 'Chip 4', 'Chip 5', 'Chip 6' and 'Chip 7') in one module. The present invention includes other configuration of module, for example, one, two, four, sixteen, or other number of chips.

The single chip 404 comprises a FMD controller 406 and a group of channel controllers 412*a-b* (e.g., channel controllers 250 of FIG. 2). The FMD controller 406 comprises all of the functions described in the descriptions corresponding to FIG. 2. The interface 403 between the host 402 and the FMD controller 406 may comprise Advance Technology Attachment (ATA), Serial ATA (SATA), Small Computer System Interface (SCSI), Universal Serial Bus (USB), PCI Express, ExpressCard, fiber channel Interface, optical connection interface circuit, etc.

FIG. 5 shows a second exemplary implementation of high performance FMD in accordance with another embodiment of the present invention. The second implementation is different from the first implementation by placing corresponding channel controller in a integrate circuit or chip that contains at least one non-volatile memory module instead of integrating with a FMD controller 506. For example, the channel controller 512*a* is located on the chip 504*a*, which includes one or more non-volatile memory chips (four chips shown as 'Chip A', 'Chip B', 'Chip M' and 'Chip N'); channel controller 512*b* located on the chip 504*b* ('Chip C', 'Chip D', 'Chip O' and 'Chip P'); and so forth. The FMD controller 506 is configured to facilitate data transfer between a host computing system 502 and the at least one non-volatile memory module via the channel controllers 512*a-b*. Generally, there is a one-to-one correlation between the channel controllers 512*a-b* and physical data channels (i.e., data channels 320 of FIG. 3A). The interface 503 is same as the interface 403 in the first implementation. The advantage of the second implementation is that channel control functions are not centralized. Furthermore, although the non-volatile memory chips shown in FIGS. 4 and 5 are raw flash memory chips, other types of flash memory chips may be used. For example, embedded flash memory chips with a controller embedded therein, or flash memory chips based on Open NAND Flash Interface (ONFi).

Figure 6:
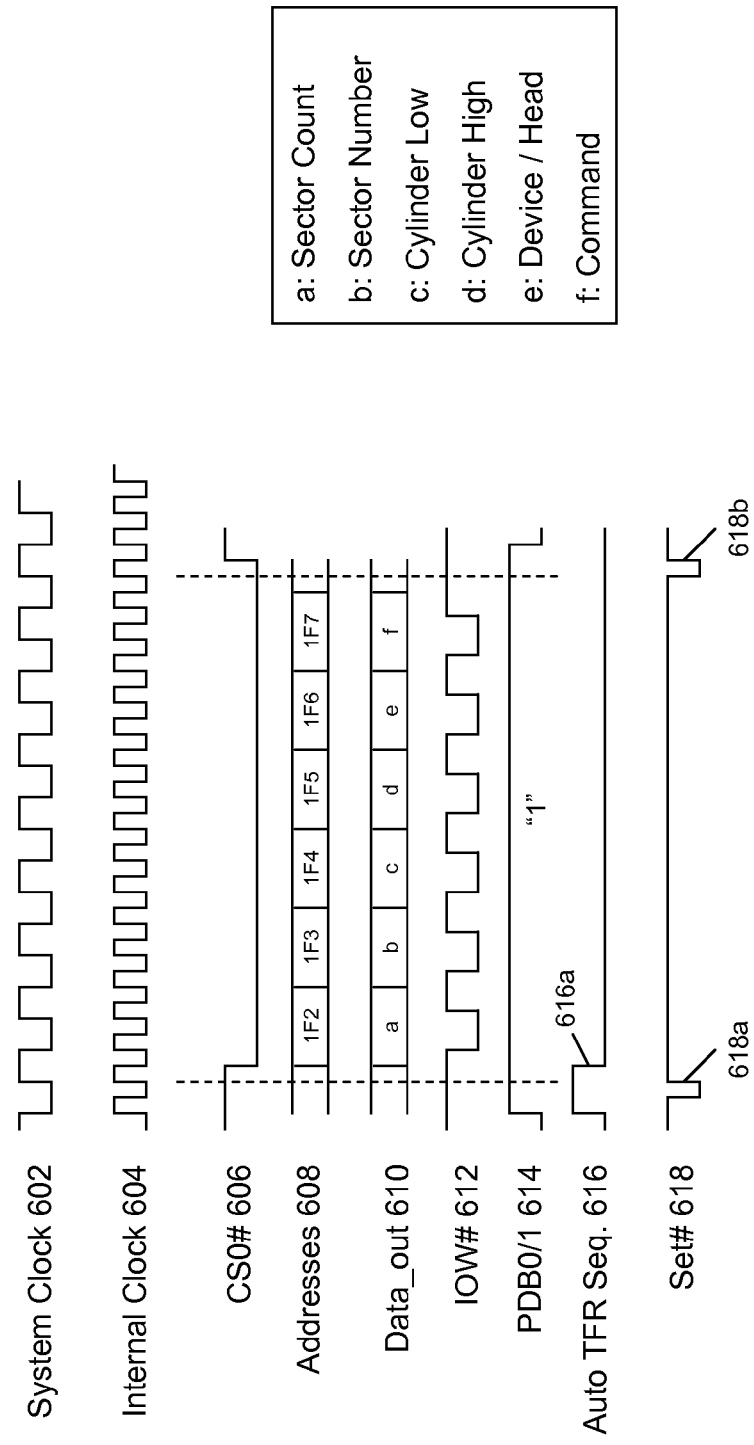
FIG. 6 is a timing chart showing relationship between various components in task file registers of the high performance FMD controller of FIG. 2 in according to an embodiment of the present invention.

Another important factor enabling the high performance FMD to achieve high performance is to use task file registers 230 of FIG. 2. FIG. 6 shows a timing chart 600 of various functions in an exemplary task file register, according to an embodiment of the present invention. The timing chart 600 shows a system clock 602 (e.g., host system clock), an internal clock 604 (e.g., FMD controller clock), a 'CS0#' 606 (i.e., chip select signal), addresses 608 (i.e., addresses for command block registers), 'data_out's 612 (i.e., data associated with one of the respective addresses 608). IOW# 614 (i.e., I/O write state signal), PDB0/1 614, Auto TFR sequence 616 and SET# 618.

The system clock 602 runs a first frequency, while the internal clock 604 runs a second frequency. The second frequency is higher than the first frequency, such that the data transfer may be conducted in a faster pace than the system clock. The lower bar in the time chart indicates that 'CS0#' 606 has been selected to allow data transfer or accept command. The addresses 608 may comprise addresses for commands, controls or data. The example in FIG. 6 shows a set of addresses for command block registers (i.e., '1F2', '1F3', '1F4', '1F5', '1F6' and '1F7'). Each of these addresses can be detected basing on specific cycles of the internal clock 604. The 'data-out's 610 represent corresponding data to each of the addresses 608. In this example related to a hard disk drive, address '1F2' is for sector count, '1F3' for sector number, '1F4' for cylinder (low-byte), '1F5' for cylinder (high-byte), '1F6' for device/head information, and '1F7' for command. The signal 'IOW#" 612 relates to I/O write signal. The 'PDB0/1' 614 signal line indicates which one of the parallel data buffers (i.e., 'data buffer 0' 314*a* and 'data buffer 1' 314*b*). In FIG. 6, the 'PDB0/1' 614 shows "1" which indicates 'data buffer 1' 314*b* is selected. The auto TFR sequence 616 shows the controller (e.g., microcontroller 220) generates a start signal 616*a*. The set line 618 shows this particular set of data is read between two signals 618*a-b*.

Figure 7A:
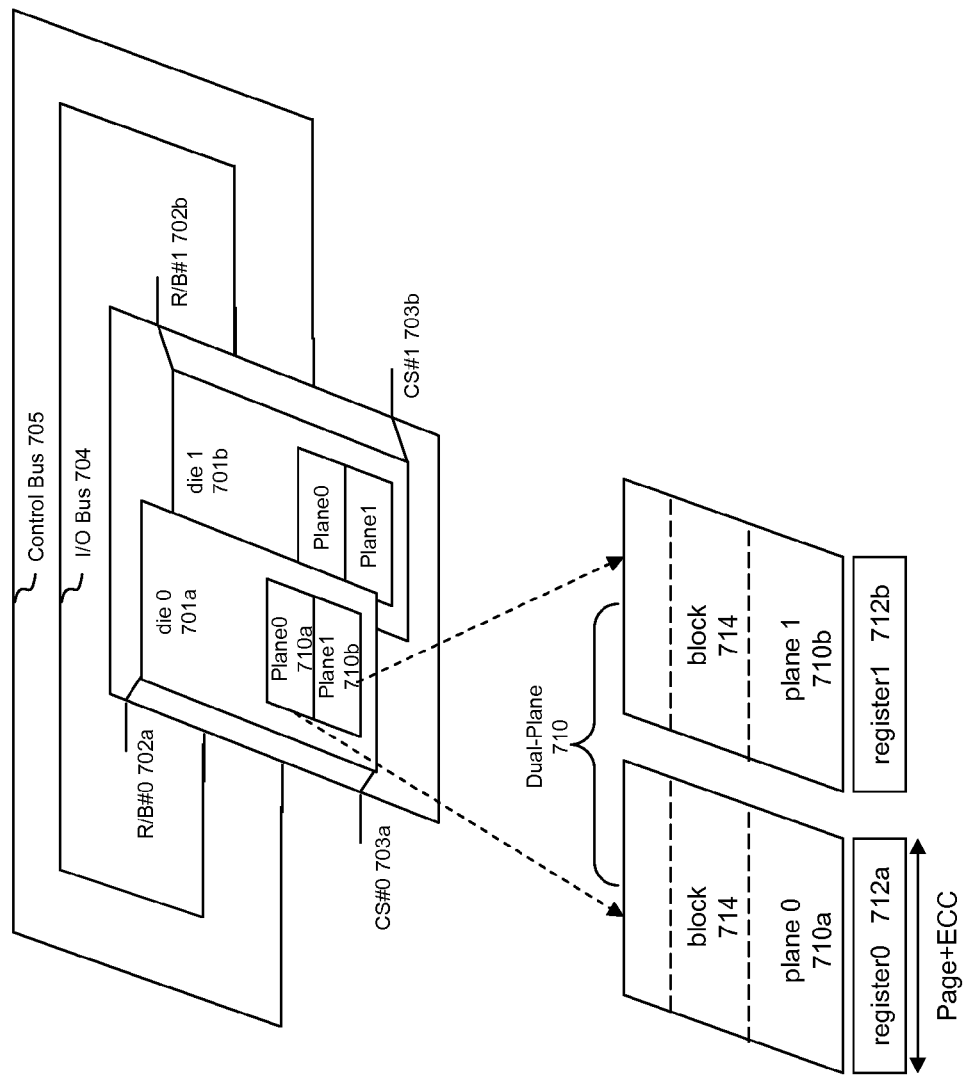
FIG. 7A is a diagram showing an exemplary non-volatile memory chip in accordance with one embodiment of the present invention.

Referring to FIG. 7A, which is a diagram showing an exemplary non-volatile memory chip or integrated circuit 700 in accordance with one embodiment of the present invention. The non-volatile memory chip 700 comprises two dies (i.e., 'die 0' 701*a* and 'die 1' 701*b*) stackedly connected to each other using a stacked chip scale package (S-CSP) technology. Each of the dies contains two planes (i.e., dual-plane 710 'plane 0' 710*a* and 'plane 1' 710*b*). Dividing memory arrays or cells on the non-volatile memory chip into two independent planes allows a host (e.g., one of the channel controllers 512*a-b* of FIG. 5) to perform two independent data transfer operations, for example, reading data from one plane, while programming (writing to) or erasing the other plane. In order to perform parallel data transfer, each of the dual-plane 710 comprises a register (i.e., 'registers' 712*a* and 'registers' 712*b*). Each register has a size equal to an ECC page size (e.g., 4096-byte page plus 64-byte ECC). Each plane contains a plurality of data blocks 714, which includes a plurality of ECC pages.

Pins configured on each die of the non-volatile memory chip 700 include four logical groups: ready/busy (R/B), chip select (CS), input/output (I/O) and control. Some of the logical groups require only one pin, others more. For example, the ready/busy and the chip select only need one (1) pin each, while the I/O bus may need eight (8) pins. In order to achieve high performance for the high performance FMD, the I/O bus 704 and the control bus 705 of 'die 0' 701*a* and 'die 1' 701*b* are wired together. The ready/busy and chip select pins are separately wired (i.e., R/B#0 702*a*, R/B#1 702*b*, CS#0 703*a* and CS#1 703*b*). R/B#0 702*a* is the pin for transmitting the read/busy state of 'die 0' 701*a*; and R/B#1 702*b* is for 'die 1' 701*b*. Pin CS#0 703*a* is for selecting 'die 0' 701*a* and CS#1 703*b* is for 'die 1' 701*b*. In other words, 'die 0' 701*a* and 'die 1' 701*b* are wired in such way that each die may be selected separately for data transfer operations.

Figure 7B:
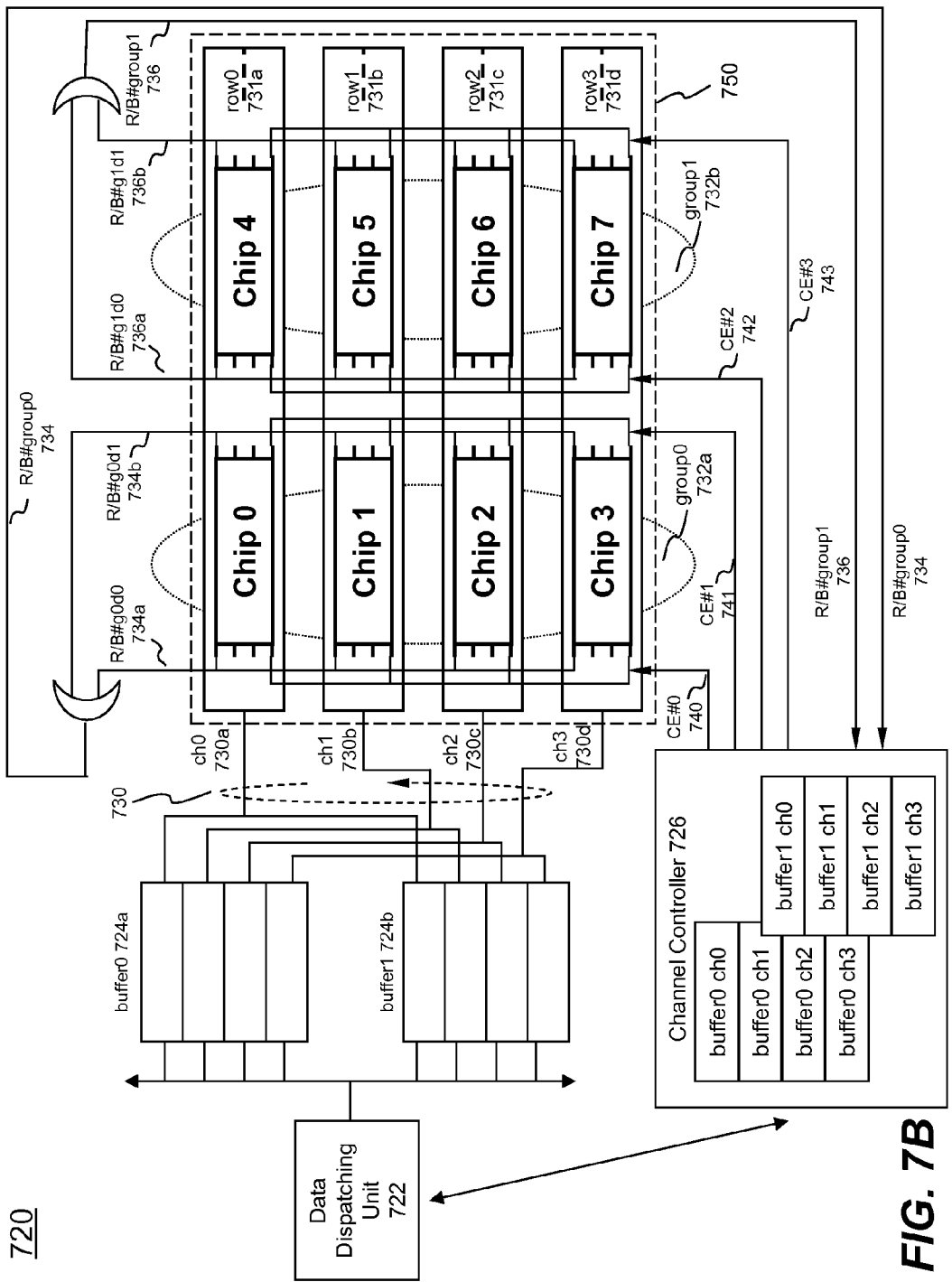
FIG. 7B is a schematic diagram showing an exemplary non-volatile memory module connecting to exemplary parallel data buffers via multiple independent data channels, according to an embodiment of the present invention.

FIG. 7B is a schematic diagram 720 showing an exemplary non-volatile memory module 750 connecting to exemplary parallel data buffers via multiple independent data channels, according to an embodiment of the present invention. The non-volatile memory module 750 comprises a plurality of non-volatile memory chips (e.g., chip 700 of FIG. 7A, eight shown as 'Chip 0', 'Chip 1', 'Chip 2', 'Chip 3', 'Chip 4', 'Chip 5', 'Chip 6', 'Chip 7'). The plurality of non-volatile memory chips are divided in two orthogonal schemes: vertical (column-wise) and horizontal (row-wise) in FIG. 7B. In this example, two groups are formed vertically while four rows are formed horizontally. 'group0' 732*a* includes 'Chip 0', 'Chip 1', 'Chip 2' and 'Chip 3'; and 'group1' 732*b* includes 'Chip 4', 'Chip 5', 'Chip 6' and 'Chip 7'. 'row0' 731*a* contains 'Chip 0' and 'Chip 4'; 'row1' 731*b* includes 'Chip 1' and 'Chip 5'; 'row2' 731*c* 'Chip 2' and 'Chip 6'; and 'row3' 731*d* 'Chip 3' and 'Chip 7'.

The chips in vertical groups are connected in the following manners:

(1) R/B#g0*d*0 734*a* connects the R/B#0 pin 702*a* of all chips in 'group0' 732*a*

(2) R/B#g0*d*1 734*b* connects the R/B#1 pin 702*b* of all chips in 'group0' 732*a*

(3) R/B#g1d0 736*a* connects the R/B#0 pin 702*a* of all chips in 'group1' 732*b*

(4) R/B#g1d1 736*b* connects the R/B#1 pin 702*b* of all chips in 'group1' 732*b*

(5) R/B#group0 734 connects R/B#g0d0 734*a* and R/B#g0d1 734*b* together (6) R/B#group1 736 connects R/B#g1d0 736*a* and R/B#g1d1 736*b* together (7) CE#0 740 connects the CS#0 pin 703*a* of all chips in 'group 0' 732*a*

(8) CE#1 741 connects the CS#1 pin 703*b* of all chips in 'group 0' 732*a*

(9) CE#2 742 connects the CS#0 pin 703*a* of all chips in 'group 1' 732*b*

(10) CE#3 743 connects the CS#1 pin 703*b* of all chips in 'group 1' 732*b*

R/B#group0 734, R/B#group1 736, CE#0 740, CE#1 741, CE#2 742 and CE#3 743 are connected to a channel controller 726 (e.g., the channel controller 250 of FIG. 2). Ready/busy state of each of R/B#group0 734 and R/B#group1 736 is sent to the channel controller 726. Accordingly, chip enable (CE) signal is selected and to enable the chips, for example, CE#0 740 may be selected to enable 'die 0' 701*a* of all of the chips in 'group0' 732*a*, CE#1 to enable 'die 1' 701*b* of all of the chips in 'group0' 732*a*, CE#2 to enable 'die 0' 701*a* of all of the chips in 'group1' 732*b*, and CE#3 to enable 'die 1' 701*b* of all of the chips in 'group1' 732*b*.

The chips in each of the horizontal groups are connected to a respective data channel 730 (i.e., one of the four shown) as follows:

(1) data channel 'ch0' 730*a* connects all chips in 'row0' 731*a*

(2) data channel 'ch1' 730*b* connects all chips in 'row1' 731*b*

(3) data channel 'ch2' 730*c* connects all chips in 'row2' 731*c*

(4) data channel 'ch3' 730*d* connects all chips in 'row3' 731*d*

Terms "vertical", "horizontal", "column-wise" and "row-wise" used herein are for the purpose of describing two orthogonal schemes. There is no physical correlation as to how these non-volatile memory chips are orientated. The chips may or may not be aligned vertically or horizontally.

The data channels 730 and horizontal rows of chips are corresponding to each other such that parallel data transfer can be conducted. As described in FIG. 3A, a set of parallel data buffers (i.e., 'buffer0' 724*a* and 'buffer1' 724*b*) is configured to hold data to be transmitted between a data dispatching unit 722 and the non-volatile memory module 750. The channel controller 726 is configured to enable properly ordered and most efficient data transfer from the set of data buffers to a specific vertical group of chips (i.e., CE#0-4) in response to the ready/busy signals received.

Figure 8A:
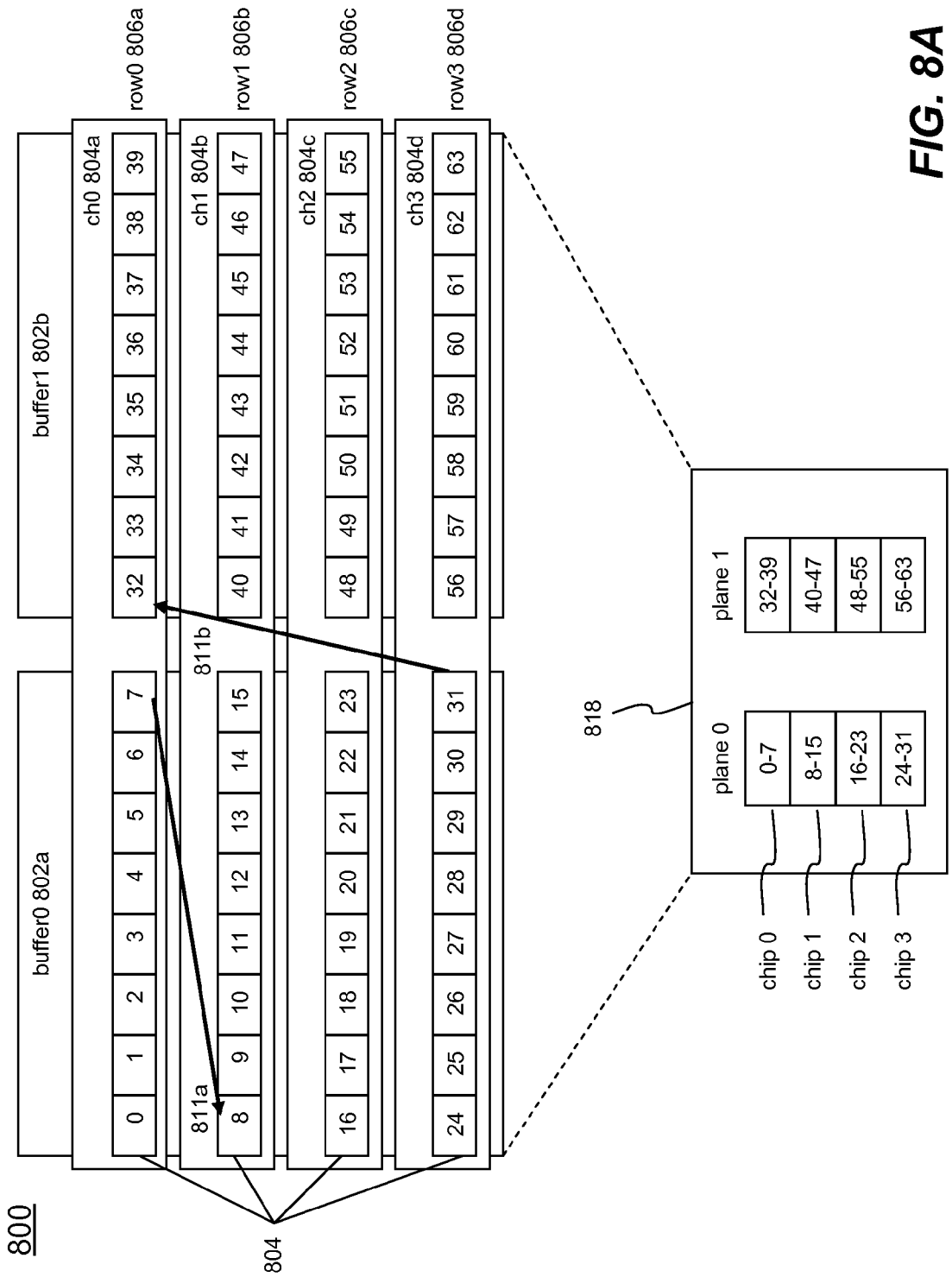
FIG. 8A is a schematic diagram showing a first exemplary interleaving data structure used in the high performance FMD, according to an embodiment of the present invention.

Another important factor for parallel data transfer is that data needs to be transferred in an interleaved manner. FIG. 8A is a schematic diagram showing a first exemplary interleaving data structure 800 used in the high performance FMD, according to an embodiment of the present invention. The first interleaving data structure 800 is described with a pair of parallel data buffers (i.e., 'buffer0' 802*a* and 'buffer1' 802*b*). Each of the parallel data buffers comprises four 4096-byte sub-buffers 804 corresponding to size of a page of the non-volatile memory chip and each sub-buffer contains eight (8) 512-byte data sectors. Because there are four independent data channels (e.g., data channels 730 of FIG. 7B), each corresponding pair of the sub-buffers 804 from 'buffer0' 802*a* and 'buffer1' 802*b* is connected to one of the data channels.

For example, a first pair of sub-buffers is connector to 'ch0' 804*a*, a second pair to 'ch1' 804*b*, a third pair to 'ch2' 804*c* and a fourth to 'ch3' 804*d*. The data channel 'ch0' 804*a* is then connected to a horizontal group of non-volatile memory chips 'row0' 806*a*. The data channel 'ch1' 804*b* to 'row1' 806*b*, and so on.

Interleaved data in the first exemplary data structure 800 is arranged in an order as shown in FIG. 8A. The data is filled into the data buffer 'buffer0' 802*a* first then into the data buffer 'buffer1' 802*b*. For example, a data cluster containing data sectors 0, 1, 2, 3, 4, 5, 6 and 7 (0-7) is filled into the first sub-buffer of 'buffer0' 802*a*, which is followed by data sectors 8-15 into the second sub-buffer (indicated by arrow 811*a*). Once the data buffer 'buffer0' 802*a* is filled up, data sectors 32-39 are filled into the first sub-buffer of 'buffer1' 802*b* as indicated by arrow 811*b* until data sectors 56-63 are filled into the fourth sub-buffer of 'buffer1' 802*b*.

A blown-up view 818 shows data to be programmed or written in one of the two dies (i.e., 'die 0' 701*a* or 'die 1' 701*b*) of a non-volatile memory chip 700 of FIG. 7A. Because data in each sub-buffer are transmitted to four different chips in any one of the vertical groups (e.g., 'group0' 732*a* or 'group1' 732*b*) via four independent data channels 730, the data transfer is conducted in parallel without any dependency to each other. For example, data sectors 0-7 is stored in 'plane 0' of 'Chip 0' (i.e., first chip in a vertical group), while data sectors 32-39 in 'plane 1' of 'Chip 0'. Data sectors 8-15 and 40-47 are stored in 'plane 0' and 'plane 1' of 'Chip 1' (i.e., second chip in a vertical group), respectively, and so forth.

Additionally, since the data in 'buffer0' 802*a* and 'buffer1' 802*b* are not contiguous (e.g., data sectors 0-7 and data sectors 32-39 are thirty-two data sectors apart), the first interleaving data structure 800 ensures that data transmitted in each data channel are not in any contention thereby allowing independent parallel data transfer operations. Furthermore, data sectors 0-7 and 32-39 are stored in different planes of a die to further disassociate with each other.

Figure 8B:
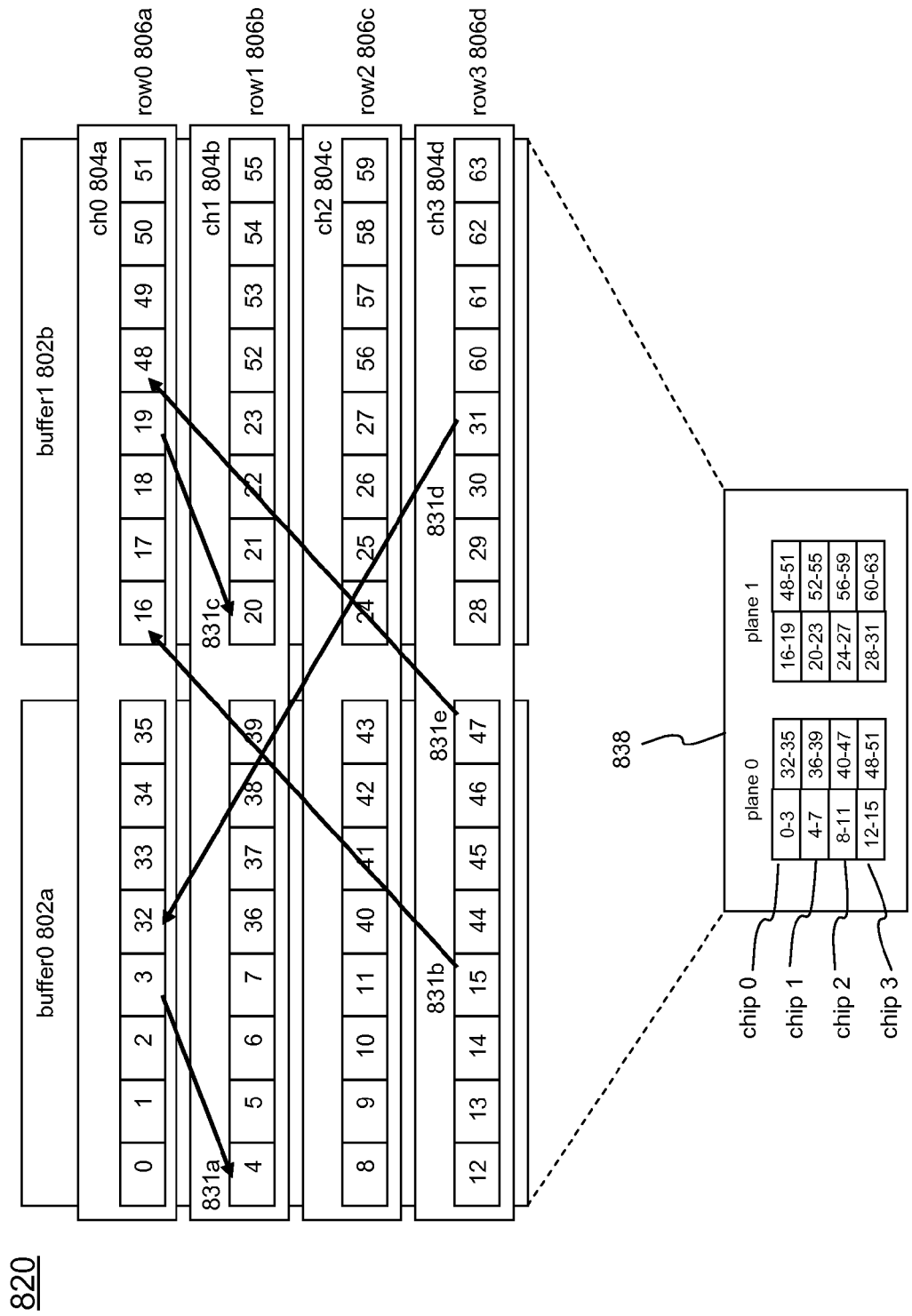
FIG. 8B is a schematic diagram showing a second exemplary interleaving data structure used in the high performance FMD, according to an embodiment of the present invention.

A second exemplary interleaving data structure 820 is shown in FIG. 8B, according to another embodiment of the present invention. The second interleaving data structure 820 is used for data transfer operations for a 2048-byte data cluster (e.g., for non-volatile memory chip having a 2048-byte page size. For example, data sectors 0-3 form a 2048-byte data cluster, which is filled into first half of the first sub-buffer of 'buffer0' 802*a*, then the next cluster (represented by data sectors 4-7) is filled into first half of the second sub-buffer as indicated by arrow 831*a*. This order continues until data sectors 12-15 are filled to the last or fourth sub-buffer of 'buffer0' 802*a*. Next, indicated by arrow 831*b*, data sectors 16-19 are filled into first half of the first sub-buffer of 'buffer1' 802*b*. Then similar order shown by arrow 831*c* is used for next data sectors 20-23 until data sectors 28-31 are filled into first half of the last sub-buffer 'buffer1' 802*b*. Following arrow 831*d*, the next data sectors 32-35 are filled into second half of the first sub-buffer of 'buffer0' 802*a*. The rest of order of filling data into the second half of the sub-buffers is the same as the order of filling data into the first half. For example, arrow 831*e* shows the data filling order after the second half of the last sub-buffer of 'buffer0' 802*a* has been filled.

Shown in a blown-up view 838, data sectors 0-3, 32-35 are stored in 'plane 0' of the first chip in one of the vertical groups (e.g., 'Chip 0' or 'Chip 4'), while data sectors 16-19 and 48-51 are stored in 'plane 1'. Other data sectors are stored similarly as indicated.

Figure 8C:
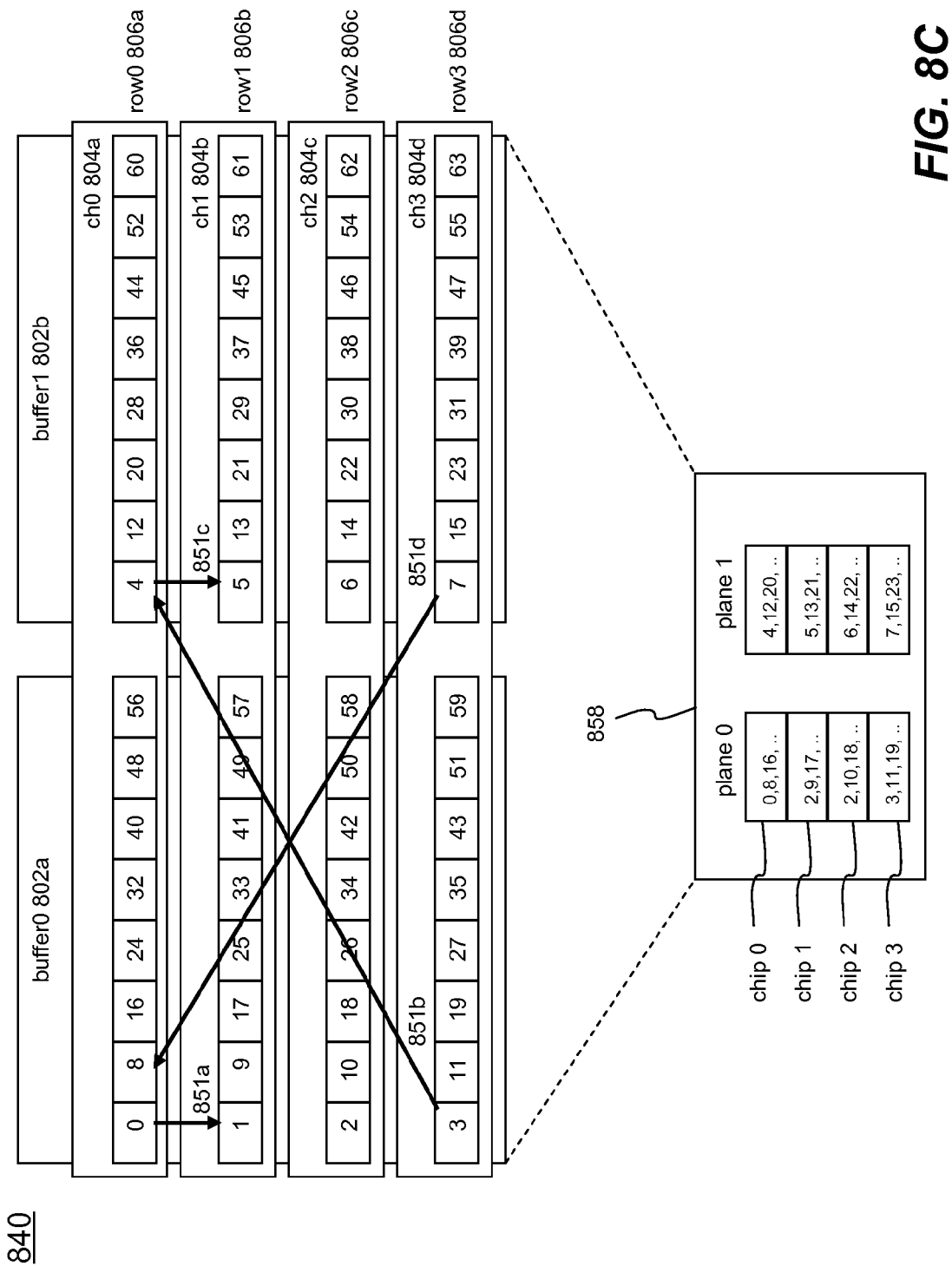
FIG. 8C is a schematic diagram showing a third exemplary interleaving data structure used in the high performance FMD, according to an embodiment of the present invention.

Referring to FIG. 8C, there is shown a third exemplary interleaving data structure 840 in accordance with one embodiment of the present invention. Data sectors are filled to the data buffers in a sequential order as indicated by arrows 851a-d. In the third data structure, each 512-byte data sector is stored in each of the sub-buffers of both data buffers in a sequential round-robin order. As shown in a blown-up view 858, data sectors 0, 8, 16, 24, 32, 40, 48 and 56 are stored in 'plane 0' of the first chip in one of the vertical groups (e.g., 'Chip 0', 'Chip 4', etc.), while data sectors 4, 12, 20, 28, 36, 44, 52 and 60 are in 'plane 1'. The rest of data sectors are stored in similar manner in other chips in the same vertical group.

Figure 9A:
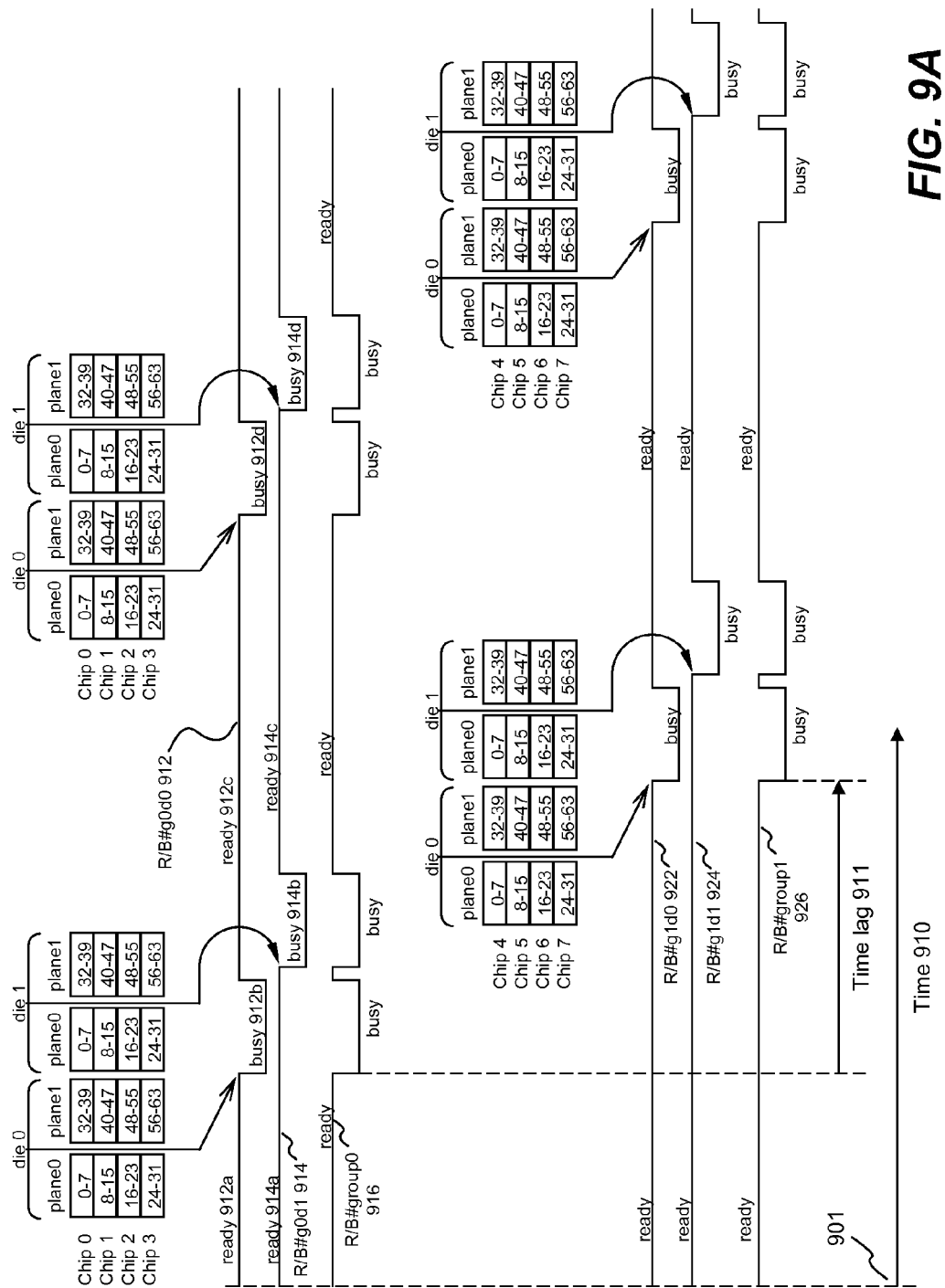
FIG. 9A is diagram showing an exemplary timing charts of data writing operations of the high performance FMD controller of FIG. 2, according to an embodiment of the present invention.

FIG. 9A is diagram showing an exemplary timing charts of data writing operations of the high performance FMD controller 200 of FIG. 2, according to an embodiment of the present invention. The first exemplary data structure 800 of FIG. 8A is used for describing the timing charts. Time is indicated by a time line 910. In the example, all read/busy signals are shown ready (i.e., the ready/busy line is at an up position) in the beginning 901 of the time line 910. Line R/B#g0d0 912 is a ready/busy signal timing chart for 'die 0' 701a of all chips in 'group0' 732a. The R/B#g0d0 line 912 shows a ready state 912a until data have been filled into the data buffers (i.e., 'buffer0' 724a and 'buffer1' 724b). Once the data buffers have been filled up, a channel controller (e.g., the channel controller 726 of FIG. 7B) starts parallel data transfer operation between respective sub-buffers of the data buffers and registers (e.g., 'register0' 712a and 'register1' 712b) of 'die 0' 701a of the corresponding non-volatile memory chips in one of the vertical groups (e.g., 'group0' 732a or 'group1' 732b). The R/B#g0d0 line 912 stays in a busy state 912b for a period of time to perform data writing operation (e.g., approximate 200 μs for each data writing operation). Once the data has been written to the corresponding registers, the R/B#g0d0 line 912 is back to a ready state 912c. The R/B#g0d0 line 912 will become busy 912d again when the channel controller starts another data transfer operation with 'die 0' of 'group 0'.

As soon as the data writing operation starts, the data buffers can be refilled with data to be written to 'die 1' 702a of all chips in 'group0' 732a. Once filled up, the data transfer can be embarked between the data buffers and registers 712a-b of 'die 1' 701b of corresponding chips in 'group1' via the data channels. As a result, line R/B#g0d1 914 switches to a busy state 914b from a ready state 914a. After the data writing operation is done, the R/B#g0d1 line 914 is back to a ready state 914c again. Similarly, the R/B#g0d1 line 914 will become busy 914d only when the channel controller starts next data transfer operation with 'die 1' of 'group0'.

Since the R/B#g0d0 pin 734a and the R/B#g0d1 pin 734b are wired together to form a R/B#group0 pin 734 (shown in FIG. 7B), the ready/busy signals are combined and shown as a R/B#group0 line 916.

Read/busy signal lines for 'die 0' and 'die 1' of 'group1' are the same as those for 'group0' with a time shift or lag 911. In other words, the channel controller controls the start of data writing operations such that the data buffers can be most efficient utilized for multiple vertical groups of non-volatile memory chips. For example, a data writing operations for 'group0' and 'group1' are alternately started such that each group may perform overlapping operations independently. Again lines R/B#g1d0 922 and R/B#g1d1 924 are combined and shown as line R/B#group1 926.

The ready/busy lines would be the same for the second and third data structure. Only the data being transmitted and stored in a different interleaved pattern.

Figure 9B:
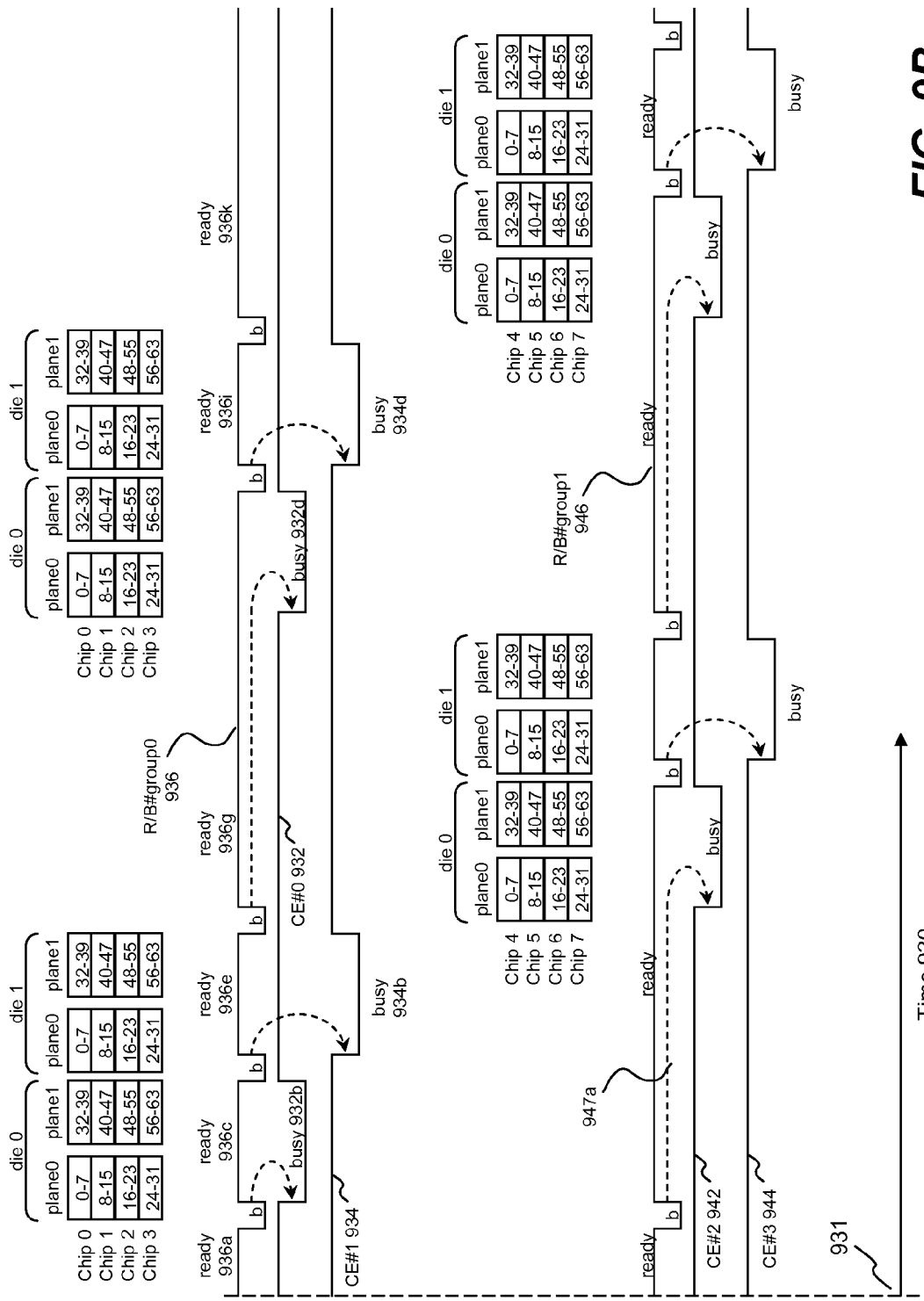
FIG. 9B is a diagram showing an exemplary timing charts of data reading operations of the high performance FMD controller of FIG. 2, according to an embodiment of the present invention.

FIG. 9B is a diagram showing an exemplary timing charts of data reading operations of the high performance FMD controller 200 of FIG. 2, according to an embodiment of the present invention. Line 'R/B#group0' 936 shows ready/busy signals time history against time line 930. In the beginning, the 'R/B#group0' line 936 shows a ready state 936a until data are retrieved or read into data buffers from both 'plane 0' and 'plane 1' of 'die 0' of all of the non-volatile memory chips in 'group0' 732a of FIG. 7B upon receiving a data read command. The 'R/B#group0' line 936 shows a short busy state (e.g., approximate 20 μs for a data reading operation). Then the 'R/B#group0' line 936 returns to a ready state 936c. At the same moment, line CE#0 932 is set to a busy state 932b until next data reading operation from 'die 1' of 'group0' starts. After the data reading operation has been done, the 'R/B#group0' line 936 again goes back to a ready state 936e, while line CE#1 934 is set to a busy state 934b. When there is one vertical group of non-volatile memory chips, this process would repeat.

However, there are two vertical groups (i.e., 'group0' and 'group1') in this example. After one set of data being read or retrieved from 'group0' 732a, the channel controller (e.g., channel controller 726 of FIG. 7B) starts another data reading operation from the next group (e.g., 'group1' 732b). This relationship is indicated in line 'R/B#group1' 746 by a dotted arrowed line 947a, which shows a time delay after data is read into data buffers. Line CE#2 942 is not set to busy state right away as the case for the CE#0 932. The channel controller waits for both lines CE#0 932 and CE#1 934 have gone back to ready state to avoid any data bandwidth contention in the data channels. Line CE#3 944 is associated with the CE#2 line 942 because both lines are for chips in the same vertical group (i.e., 'group1' 732b). The staggering or alternating data reading operation continues for 'group0' and 'group1', so that most efficient utilization of resources (e.g., data channels, data buffers, data registers, etc.) can be achieved thereby providing a high performance FMD.

In addition, each data reading operation includes reading data from one of the planes of one of the dies of non-volatile memory chips to fill one of the parallel data buffers (e.g., 'data buffer 0' 314a and 'data buffer 1' 314b). After one of the data buffers is filled up with the data, the filled data are moved to the host, while the other data buffer can be simultaneously filled with data from another plane of the non-volatile memory chips. Overlap operations ensure additional efficiency.

Furthermore, when other different data interleaving schemes are used, the timing charts shown in FIGS. 9A-9B would still be the same, only difference is order of the data in the data buffers and in the non-volatile memory chips.

Figure 10A:
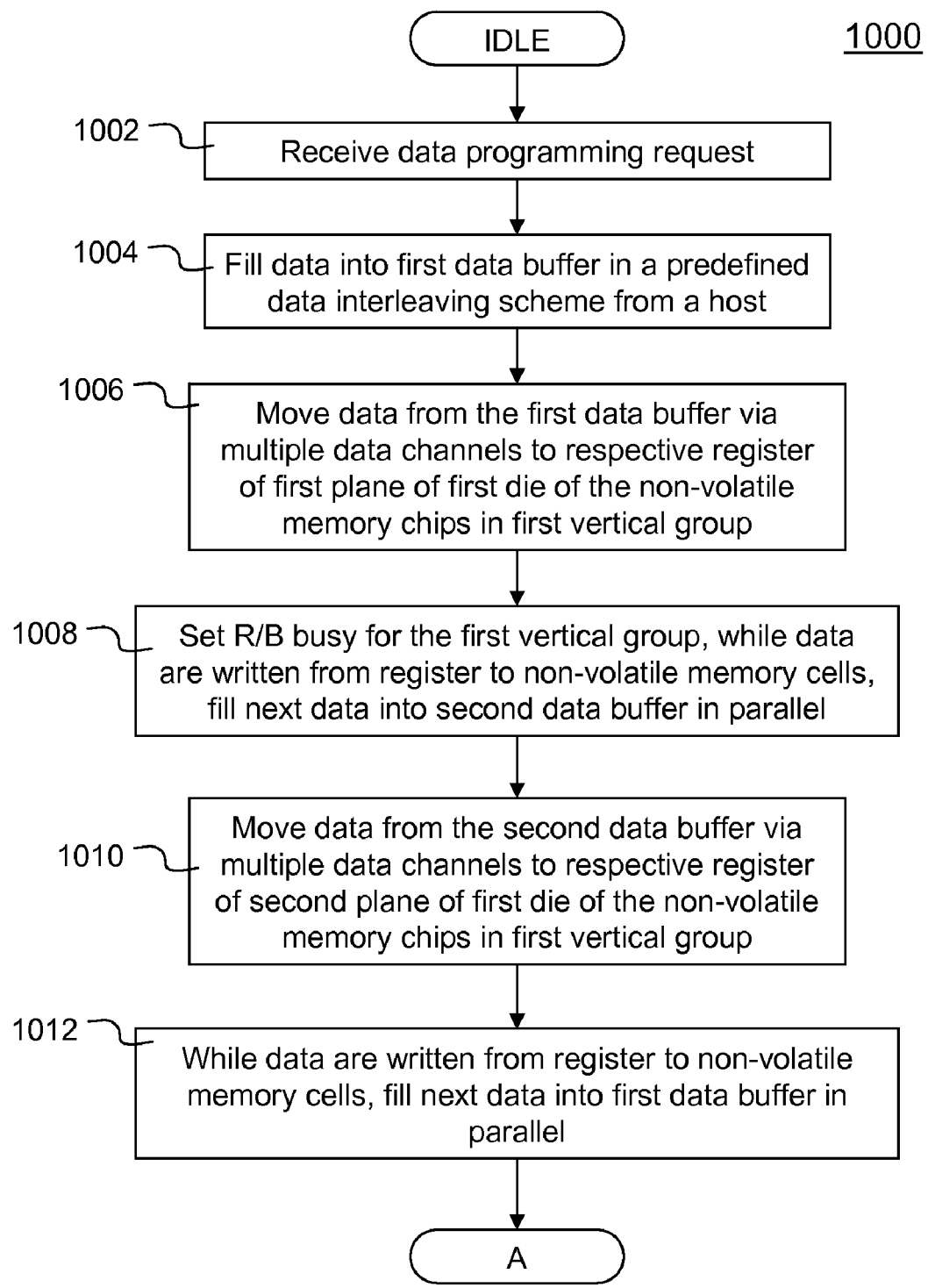
Figure 10C:
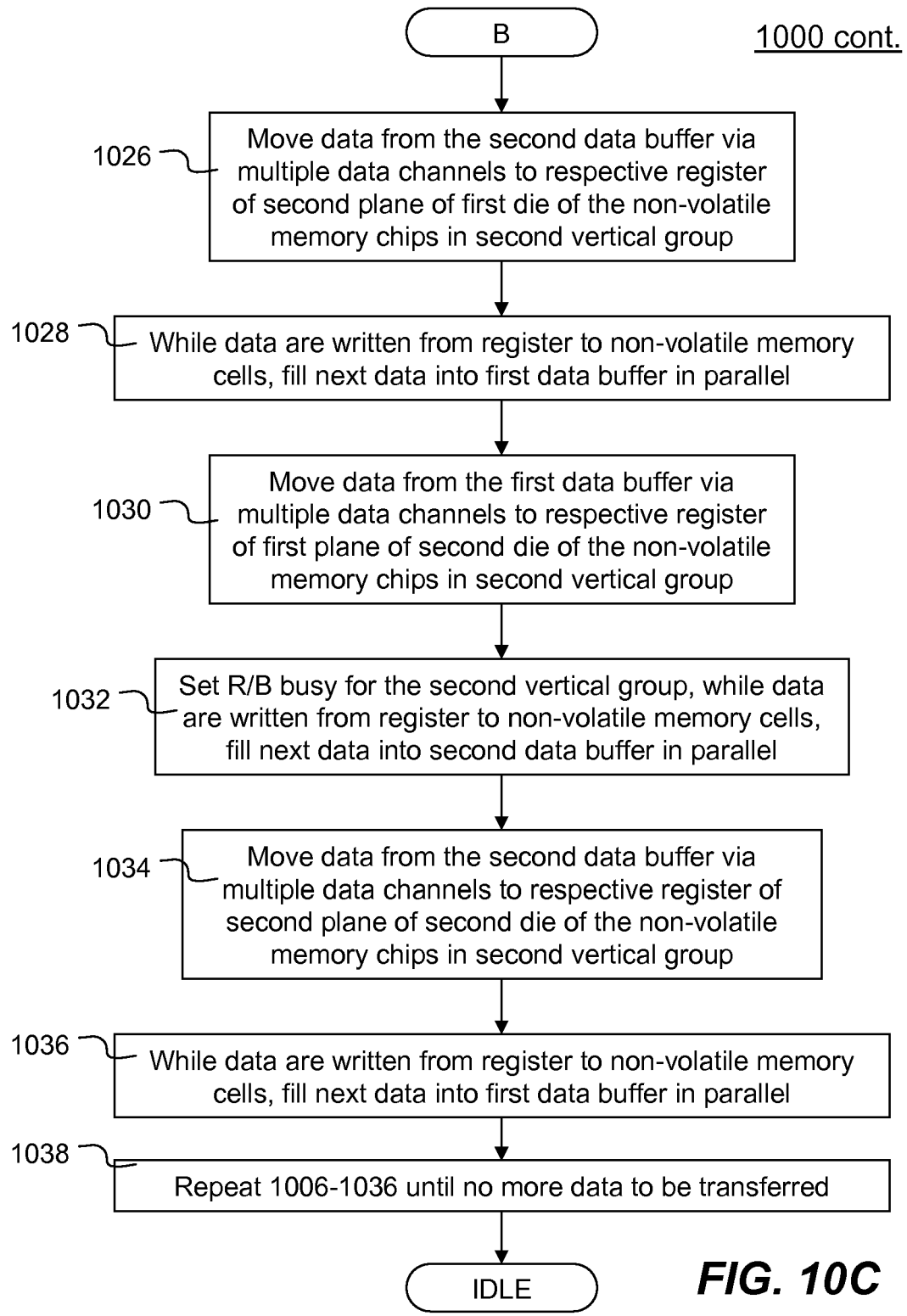

FIGS. 10A-10C collectively show a flowchart illustrating an exemplary process 1000 of data programming/writing operation in the high performance FMD controller 200 of FIG. 2 according to an embodiment of the present invention. The process 1000 is preferably understood in conjunction with previous figures especially FIGS. 7A-7B, and 8A-8C. The process 1000 starts in an IDLE state until the high performance FMD controller receives a data transfer request (i.e., a data programming or writing request in this embodiment) from a host (e.g., a computer device, a consumer electronic device) at 1002. Next, at 1004, the process 1000 fills a first chunk of data to a first data buffer (e.g., 'buffer0' 724a) in a predefined data interleaving scheme such as the ones shown in FIGS. 8A-8C. Once the first data buffer has been filled, the first chunk of data is moved to respective register 712a of a first plane 710a of a first die 701a of a first vertical group 732a of the non-volatile memory chips via a set of data channels 730a-d at 1006. Then at 1008, the process 1000 sets the ready/busy signal (e.g., 'R/B#group0' 734) for all of the non-volatile memory chips in the first vertical group 732a to busy when the first chunk of data are written or programmed from the respective register to corresponding location in the first plane of the first die of the first group 732a of the non-volatile memory chips. In the mean time, a second chunk of data are filled into a second data buffer (e.g., 'buffer1' 724b) in parallel. At 1010, the process 1000 moves the second chunk of data from the second data buffer 724b to respective register 712b of a second plane 710b of the first die 701a of the first group 732a of the non-volatile memory chips. While the second chunk of data are written from the respective register to corresponding location in the non-volatile memory chips, the process 1000 fills a third chunk of data into to the first data buffer 724a (which is available for accepting new data now) in parallel from the host at 1012. At 1014, the third chunk of data is moved from the first data buffer 724a to respective register of a first plane of a second die of the first group 732a of non-volatile memory chips. Next at 1016, the process 1000 sets the ready/busy signal 734 for all non-volatile memory chips in the first vertical group to busy, while writing the third chunk data from the respective register to corresponding location in the non-volatile memory chips. Again, in parallel, the process 1000 fills a fourth chunk data into the second data buffer 724b from the host. Next, the fourth chunk of data is moved from the second data buffer 724b to respective register of a second plane of the second die of the first vertical group 732a at 1018. At 1020, the process 1000 fills a fifth chunk of data to the first data buffer 724a in the predefined data interleaving scheme from the host, while the fourth chunk of data is written from the respective register to corresponding location of the first vertical group 732a of non-volatile memory chips.

At 1022, the process 1000 moves the fifth chunk of data from the first data buffer 724a to respective register of a first plane of a first die of a second group 732b of non-volatile memory chips. Then the process 1000 sets the read/busy signal 736 for the second group of non-volatile memory chips to busy, while the fifth chunk of data is written from the respective register to corresponding location. In parallel, the process 1000 fills a sixth chunk of data in the predefined data interleaving scheme into the second data buffer 724b at 1024. Next at 1026, the process 1000 moves the sixth chunk of data from the second data buffer 724b to respective register of a second plane of the first die of the second vertical group 732b. The sixth chunk of data is then written from the respective register to corresponding location in the non-volatile memory chips and a seventh chunk of data is filled into the first data buffer 724a from the host at 1028. Next, at 1030, the process 1000 moves the seventh chunk of data from the first data buffer 724a to respective register of a first plane of a second die of the second vertical group 732b. The process 1000 then sets the ready/busy signal for the second group 736 to busy, while the seventh chunk of data is written from the respective register to corresponding location. And the process 1000 fills an eighth chunk of data from the host to the second data buffer 724b in parallel at 1032. At 1034, the process 1000 moves the eighth chunk of data from the second data buffer to respective register of a second plane of the second die of the second vertical group 732b. Next, the process 1000 fills a ninth or another first chunk of data to the first data buffer 724a, while the eighth chunk of data is written from the respective register to corresponding location of the non-volatile memory chips. Finally, at 1038, the process 1000 repeats overlapping data programming/writing operations of steps 1006-1036 until the data programming/writing request has been fulfilled before the process 1000 moves back to the initial IDLE state.

Figure 10D:
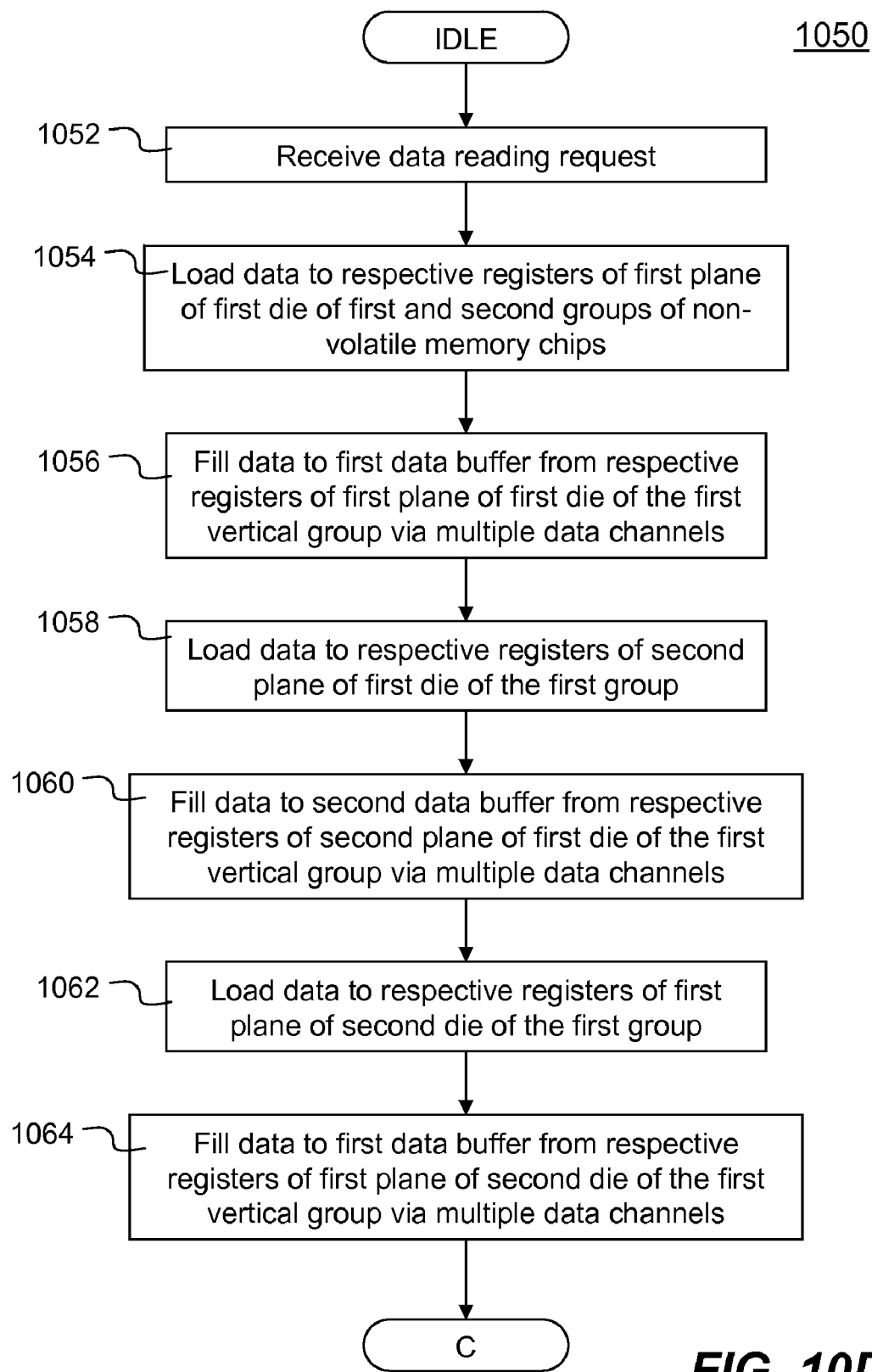
Figure 10F:
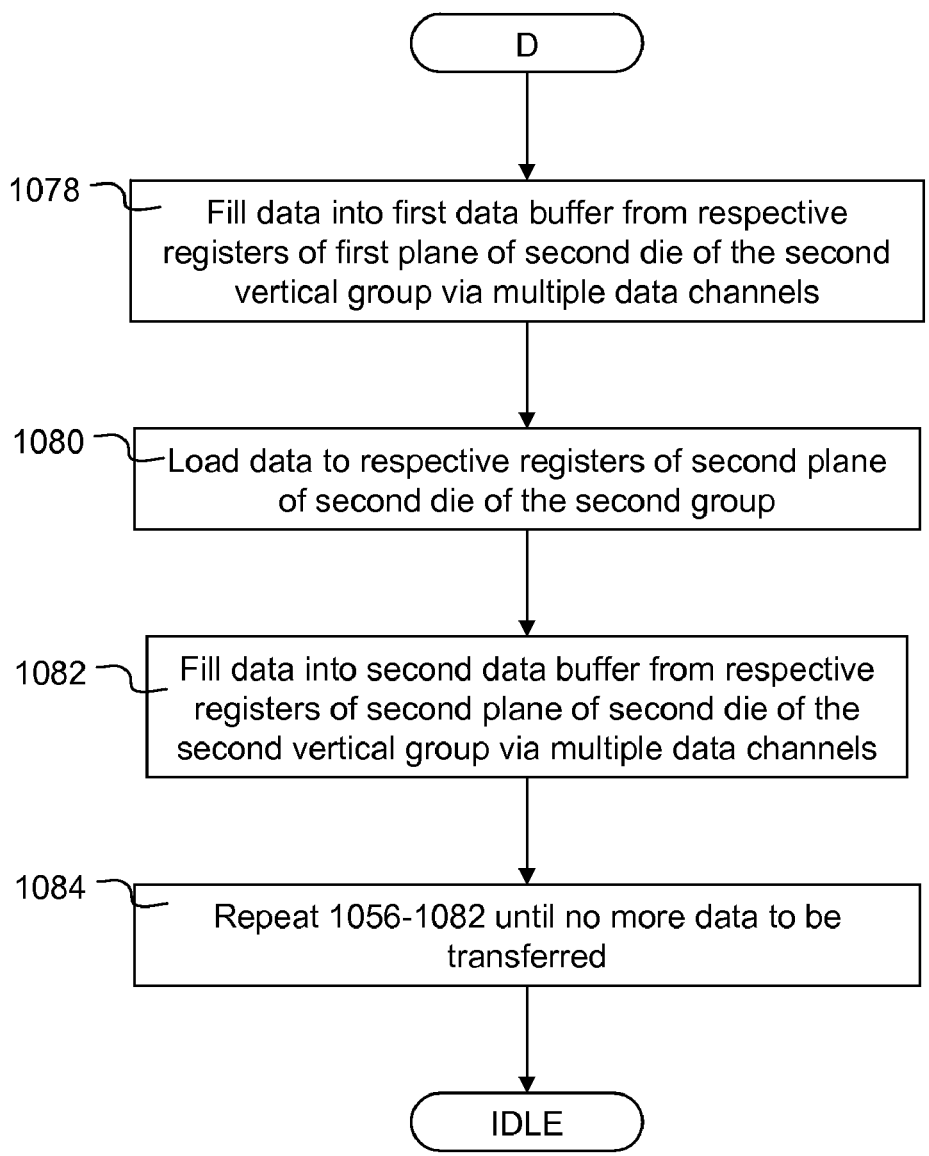

FIGS. 10D-10F collectively show a flowchart illustrating an exemplary process 1050 of data reading operation in the high performance FMD controller 200 of FIG. 2 according to an embodiment of the present invention. The process 1050 is preferably understood in conjunction with previous figures especially FIGS. 7A-7B and 8A-8C. The process 1050 starts in an IDLE state until a data reading request is received at 1052. At 1054, the process 1050 loads a first chunk of data from the non-volatile memory chips to respective register 712a of a first plane 710a of a first die 701a of a first vertical group 732a. And the process 1050 loads a fifth chunk of data from the non-volatile memory chips to respective register of a first plane of a first die of a second vertical group 732b. A typical time for the operation of step 1054 is about 20 μs. Once the first chunk of data has been loaded into the respective register, the process 1050 fills the first chunk of data into a first data buffer 724a from the respective register via a set of data channels (e.g., 'ch0' 730a, 'ch1' 730b, 'ch2' 730c and 'ch3' 730d) at 1056. Next, at 1058, the process 1050 loads a second chunk of data to respective register 712b of a second plane 710b of the first die 701a of the first vertical group 732a of non-volatile memory chips and sends the first chunk of data from the first data buffer to a host (e.g., a computer, a an electronic consumer device). Then, at 1060, the process 1050 fills the second chunk of data into a second data buffer 724b from the respective register. The process 1050 again loads a third chunk of data to respective register of a first plane of a second die 701b of the first vertical group 732b and sends the second chunk of data to the host from the second data buffer 724b at 1062. Next, at 1064, the third chunk of data is filled into the first data buffer 724a (it is now available because the data has been moved to the host) from the respective register. At 1066, the process 1050 loads a fourth chunk of data to respective register of a second plane of the second die of the first vertical group 732a and sends the third chunk of data from the second data buffer 724b to the host in the mean time.

At 1068, the process 1050 fills the fourth chunk of data into the second data buffer 724b from the respective register. Next, at 1070, the process 1050 fills the fifth chunk of data into the first data buffer 724a from the respective register of the first plane of the first die of the second group 732b, and sends the fourth chunk of data from the second data buffer to the host. Next, at 1072, the process 1050 loads a sixth chunk of data to respective register of a second plane of the first die of the second group 732b of non-volatile memory chips, and sends the fifth chunk of data from the first data buffer to the host. The process 1050 then fills the sixth chunk of data from the respective register to the second data buffer 724b at 1074. At 1076, the process 1050 loads a seventh chunk of data to respective register of a first plane of a second die of the second vertical group 732b and sends the sixth chunk of data from the second data buffer 724b to the host. Next, at 1078, the process 1000 fills the seventh chunk of data into the first data buffer 724a from the respective register. Then the process 1050 loads an eighth chunk of data into respective register of a second plane of the second die of the second vertical group 732b and sends the seventh chunk of data from the first data buffer 724a to the host at 1080. Next, at 1082, the process 1050 fills the eighth chunk of data into the second data buffer from the respective register via the set of data channels 730a-d. Finally, at 1084, the process 1050 repeats overlapping data reading operations of steps 1056-1082 until the data reading request has been fulfilled. The process 1050 goes back to the IDLE state.

Each of the first and second data buffers 724a-b comprises at least one sub-buffer (e.g., four sub-buffers are shown in FIGS. 8A-8C). The number of the sub-buffers matches the number of data channels (e.g., data channel 'ch0', 'ch1', 'ch2', 'ch3' 730a-d of FIG. 7B). Exemplary data interleaving schemes are illustrated in FIGS. 8A-8C. The data interleaving is achieved by the following steps: (1) partitioning each of the sub-buffers into at least one data cluster, (2) filling data into a first data cluster of the at least one data cluster of each of the sub-buffers of the first data buffer then into a first data cluster of the at least one data cluster of each of the sub-buffers of the second data buffer in a sequential order, (3) if necessary, filling data into a next data cluster of the at least one data cluster of each of the sub-buffers of the first data buffer then into a next data cluster of the at least one data cluster of each of the sub-buffers of the second data buffer in a sequential order, and (4) repeating step (3) until all of the data buffers have been filled up.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas non-volatile memory chip has been described and shown with a page size of 4096-byte, other sizes such as 2048-byte may also be used. Additionally, whereas data buffers and data channels are shown and described as four-channel connecting to a pair of parallel data buffers to perform interleaved data transfer operations, other higher numbers of data buffers and channels (e.g., four, eight or even higher) may be used to accomplish the same or better efficiency. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A high performance flash memory device (FMD) comprising:
    a FMD interface configured to provide data input and output to a host computer system;
    at least one non-volatile memory module having one or more non-volatile memory chips that are arranged in a plurality of vertical groups and in a plurality of horizontal rows such that each of the vertical groups and each of the horizontal rows having one of said one or more non-volatile memory chips overlapped, wherein number of the non-volatile memory chips in said each of the vertical groups is equal to number of the plurality of horizontal rows; and
    a FMD controller configured to control data transmission between said at least one non-volatile memory module and the host computer system via said FMD interface, said FMD controller comprises a microcontroller, a plurality of parallel data buffers and a plurality of independent data channels, each of the parallel data buffers is divided into a plurality of sub-buffers, each of the sub-buffers is connected to corresponding one of the parallel data channels, wherein each of the data channels connects to respective one of the horizontal rows and wherein said data transmission is conducted in parallel via the independent data channels in one of at least one data interleaving scheme.

2. The high performance FMD of claim 1 further comprises at least one channel controller configured to control data transfer between the plurality of the parallel data buffers and said at least one non-volatile memory module.

3. The high performance FMD of claim 2, wherein said at least one channel controller is integrated within the FMD controller.

4. The high performance FMD of claim 2, wherein said at least one channel controller is included with said at least one non-volatile memory module.

5. The high performance FMD of claim 2, wherein said FMD interface comprises one of an Advanced Technology Attachment (ATA), Serial ATA (SATA), Small Computer System Interface (SCSI), Universal Serial Bus (USB), Peripheral Component Interconnect (PCI) Express, ExpressCard, fiber channel Interface, optical connection interface circuit or Secure Digital.

6. The high performance FMD of claim 2, wherein each of said one or more volatile memory chips include two dies stackedly attached to each other using a stacked chip scale package technology.

7. The high performance FMD of claim 6, wherein the dies are wired in such manner that I/O pins and control pin are shared while ready/busy and chip select pins are separately selectable.

8. The high performance FMD of claim 7, wherein each of the dies includes at least two planes, each of the planes comprises an independently accessible register.

9. The high performance FMD of claim 7, wherein a respective chip select pin of all of the non-volatile memory chips is wired together such that a particular chip enable signal from said at least one channel controller activates corresponding one of the dies of all of the non-volatile memory chips in said each of the vertical groups.

10. The high performance FMD of claim 7, wherein the ready/busy pin of both of the dies of all of the non-volatile memory chips in said each of the vertical groups is wired in such manner that a ready/busy signal for a particular one group of the vertical groups is detectable as a whole at said at least one channel controller.

11. The high performance FMD of claim 6, wherein each of the dies is a single-level cell flash memory die or a multi-level cell flash memory die.

12. The high performance FMD of claim 2, wherein said FMD controller further comprises a plurality of command registers, a control register, a data register, a high-low byte filter, a data multiplexer, a command decoder, a data dispatching unit, an error correction code generator and a plurality of task file registers.

13. The high performance FMD of claim 12, wherein the command decoder is configured to decode commands and control signals received at the command registers and the control register, respectively, and the commander decoder is coupled to the data multiplexer, the microcontroller and the plurality of task file registers to process the decoded commands.

14. The high performance FMD of claim 12, wherein the data register is configured to receive information from the FMD interface, then, if necessary, the received information is separated into high-byte and low byte by the high-low byte filter before sending to the task file registers to be processed via the data multiplexer.

15. The high performance FMD of claim 14, wherein the received information include, but are not necessarily limited to, logical address, data count, high and low bytes of a buffer address pointer, and high and low bytes of a corresponding data.

16. The high performance FMD of claim 15, wherein the data dispatching unit fills the corresponding data into the plurality of parallel data buffers using the received information.

17. The high performance FMD of claim 16, wherein the corresponding data is organized in said one of the at least one data interleaving scheme.

18. The high performance FMD of claim 2, further comprises a cache configured for holding recently transferred data.

19. The high performance FMD of claim 18, wherein the cache comprises hierarchical cache made of static random access memory (SRAM) as a first level cache and dynamic RAM (DRAM) as a second level cache.

20. A method of data reading operations in high performance flash memory device (FMD) having at least two groups of at least one non-volatile memory chip, each of the non-volatile memory chips includes at least two dies, each of the dies includes two planes, the dies share input/output and control buses but are selectable individually, said method comprising:
- (a1) receiving a data read request;
- (a2) loading a first chunk of data to respective register of a first plane of a first die of a first group of non-volatile memory chips, and loading a fifth chunk of data to respective register of a first plane of a first die of the second group;
- (a3) filling the first chunk of data from the respective register of the first plane of the first die of the first group into a first data buffer;
- (a4) while the first chunk of data in the first data buffer is transferred to a host according to a predefined data interleaving scheme, loading a second chunk of data to respective register of a second plane of the first die of the first group, and then filling the second chunk of data from the respective register of the second plane of the first die of the first group into a second data buffer;
- (a5) while the second chunk of data in the second data buffer is transferred to the host according to the predefined data interleaving scheme, loading a third chunk of data to respective register of a first plane of a second die of the first group, and then filling the third chunk of data from the respective register of the first plane of the second die of the first group into the first data buffer;
- (a6) while the third chunk of data in the first data buffer is transferred to the host according to the predefined data interleaving scheme, loading a fourth chunk of data to respective register of a second plane of the second die of the first group, and then filling the fourth chunk of data from the respective register of the second plane of the second die of the first group into the second data buffer;
- (a7) while the fourth chunk of data in the second data buffer is transferred to the host according to the predefined data interleaving scheme, loading a new first chunk of data to respective register of the first plane of the first die of the first group, and filling the fifth chunk of data from the respective register of the first plane of the first die of the second group into the first data buffer;
- (a8) while the fifth chunk of data in the first data buffer is transferred to the host according to the predefined data interleaving scheme, loading a sixth chunk of data to respective register of a second plane of the first die of the second group, and then filling the sixth chunk of data from the respective register of the second plane of the first die of the second group into the second data buffer;
- (a9) while the sixth chunk of data in the second data buffer is transferred to the host according to the predefined data interleaving scheme, loading a seventh chunk of data to respective register of a first plane of a second die of the second group, and then filling the seventh chunk of data from the respective register of the first plane of the second die of the second group into the first data buffer;
- (a10) while the seventh chunk of data in the first data buffer is transferred to the host according to the predefined data interleaving scheme, loading for an eighth chunk of data to respective register of a second plane of the second die of the second group, and then filling the eighth chunk of data from the respective register of the second plane of the second die of the second group into the second data buffer;
- (a11) while the eighth chunk of data in the second data buffer is transferred to the host according to the predefined data interleaving scheme, loading a new fifth chunk of data to respective register of the first plane of the first die of the second group; and
- (a12) repeating steps (a3)-(a11) until said data read request has been fulfilled.

21. The method of claim 20, wherein each of the first and second data buffers includes corresponding numbers of sub-buffers matching number of the at least one non-volatile memory chip in each of the first and second groups.

22. The method of claim 21, wherein the predefined data interleaving scheme further comprising:
- partitioning each of the sub-buffers into at least one cluster;
- filling data into a first cluster of the at least one cluster of each of the sub-buffers in the first data buffer then a first cluster of the at least one cluster of said each of the sub-buffers in the second data buffer sequentially; and
- if required, filling data into a next cluster of the at least one cluster of said each of the sub-buffers in the first data buffer then a next cluster of the at least one cluster of said each of the sub-buffers in the second data buffer sequentially, until all of the data buffers have been filled up.

23. The method of claim 22, wherein each of the one or more clusters comprises a maximum size equaling to size of the sub-buffer and a minimum size equaling to size of a data sector.

24. A method of data programming operations in high performance flash memory device (FMD) having at least two groups of at least one non-volatile memory chips, each of the non-volatile memory chips includes at least two dies, each of the dies includes two planes, the dies share input/output and control buses but are selectable individually, said method comprising:
- (b1) receiving a data program request;
- (b2) filling a first chunk of data into a first data buffer in a predefined data interleaving scheme from a host;
- (b3) moving the first chunk of data from the first data buffer into a respective register of a first plane of a first die of a first group of non-volatile memory chips;
- (b4) while the first chunk of data is written from the respective register to corresponding location of the non-volatile memory chips, setting read/busy signal of all of the non-volatile memory chips in the first group to busy and filling a second chunk of data into a second data buffer in the predefined data interleaving scheme from the host;
- (b5) moving the second chunk of data from the second data buffer into respective register of a second plane of the first die of the first group;
- (b6) while the second chunk of data is written from the respective register to corresponding location of the non-volatile memory chips, setting read/busy signal of all of the non-volatile memory chips in the first group to busy and filling a third chunk of data into the first data buffer in the predefined data interleaving scheme from the host;
- (b7) moving the third chunk of data from the first data buffer into respective register of a first plane of a second die of the first group;
- (b8) while the third chunk of data is written from the respective register to corresponding location of the non-volatile memory chips, setting read/busy signal of all of the non-volatile memory chips in the first group to busy and filling a fourth chunk of data into the second data buffer in the predefined data interleaving scheme from the host;

(b9) while the fourth chunk of data is written from the respective register to corresponding location of the non-volatile memory chips, setting read/busy signal of all of the non-volatile memory chips in the first group to busy and filling a fifth chunk of data into the first data buffer in the predefined data interleaving scheme from the host;

(b10) moving the fifth chunk of data from the first data buffer into respective register of a first plane of a first die of a second group;

(b11) while the fifth chunk of data is written from the respective register to corresponding location of the non-volatile memory chips, setting read/busy signal of all of the non-volatile memory chips in the second group to busy and filling a sixth chunk of data into the second data buffer in the predefined data interleaving scheme from the host;

(b12) moving the sixth chunk of data from the second data buffer into respective register of a second plane of the first die of the second group;

(b13) while the sixth chunk of data is written from the respective register to corresponding location of the non-volatile memory chips, setting read/busy signal of all of the non-volatile memory chips in the second group to busy and filling a seventh chunk of data into the first data buffer in the predefined data interleaving scheme from the host;

(b14) moving the seventh chunk of data from the first data buffer into respective register of a first plane of a second die of the second group;

(b15) while the seventh chunk of data is written from the respective register to corresponding location of the non-volatile memory chips, setting read/busy signal of all of the non-volatile memory chips in the second group to busy and filling an eighth chunk of data into the second data buffer in the predefined data interleaving scheme from the host;

(b16) moving the eighth chunk of data from the second data buffer into respective register of a second plane of the second die of the second group;

(b17) while the eighth chunk of data is written from the respective register to corresponding location of the non-volatile memory chips, setting read/busy signal of all of the non-volatile memory chips in the second group to busy and filling a new first chunk of data into the first data buffer if required; and (b18) repeating steps (b3)-(b17) until the data programming request has been fulfilled.

25. The method of claim 24, wherein each of the first and second data buffers includes corresponding numbers of sub-buffers matching number of the at least one non-volatile memory chip in each of the first and second groups.

26. The method of claim 25, wherein the predefined data interleaving scheme further comprising:
  partitioning each of the sub-buffers into at least one cluster;
  filling data into a first cluster of the at least one cluster of each of the sub-buffers in the first data buffer then a first cluster of the at least one cluster of said each of the sub-buffers in the second data buffer sequentially; and
  if required, filling data into a next cluster of the at least one cluster of said each of the sub-buffers in the first data buffer then a next cluster of the at least one cluster of said each of the sub-buffers in the second data buffer sequentially, until all of the data buffers have been filled up.

27. The method of claim 26, wherein each of the one or more clusters comprises a maximum size equaling to size of the sub-buffer and a minimum size equaling to size of a data sector.

* * * * *